(12) United States Patent
Kuwahara et al.

(10) Patent No.: US 12,035,576 B2
(45) Date of Patent: *Jul. 9, 2024

(54) SUBSTRATE TREATING APPARATUS AND SUBSTRATE TRANSPORTING METHOD

(71) Applicant: SCREEN Holdings Co., Ltd., Kyoto (JP)

(72) Inventors: Joji Kuwahara, Kyoto (JP); Koji Kaneyama, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 581 days.

This patent is subject to a terminal disclaimer.

(21) Appl. No.: 17/101,127

(22) Filed: Nov. 23, 2020

(65) Prior Publication Data

US 2021/0159293 A1 May 27, 2021

(30) Foreign Application Priority Data

Nov. 27, 2019 (JP) .................................. 2019-214462

(51) Int. Cl.
*H01L 27/12* (2006.01)
*H01L 21/67* (2006.01)
(Continued)

(52) U.S. Cl.
CPC ..... *H10K 59/124* (2023.02); *H01L 21/67178* (2013.01); *H01L 21/67742* (2013.01); *H01L 21/67745* (2013.01); *H01L 21/67766* (2013.01)

(58) Field of Classification Search
CPC .................. H01L 21/67178; H01L 21/67775
See application file for complete search history.

(56) References Cited

U.S. PATENT DOCUMENTS

| 5,844,662 A | 12/1998 | Akimoto et al. ................ 355/27 |
| 2004/0005149 A1 | 1/2004 | Sugimoto et al. ............ 396/564 |

(Continued)

FOREIGN PATENT DOCUMENTS

| JP | H09-045613 A | 2/1997 |
| JP | H09-120984 A | 5/1997 |

(Continued)

OTHER PUBLICATIONS

Notice of Allowance dated Mar. 8, 2022 for corresponding Korean Patent Application No. 10-2020-0160966.

(Continued)

*Primary Examiner* — Parviz Hassanzadeh
*Assistant Examiner* — Nathan K Ford
(74) *Attorney, Agent, or Firm* — OSTROLENK FABER LLP

(57) ABSTRACT

Disclosed are a substrate treating apparatus and a substrate transporting method. A first treating block includes a developing-treatment layer and an interface layer arranged in an up-down direction. Accordingly, the interface layer is couplable with the indexer block. Moreover, a substrate transport mechanism of the indexer block transports a substrate from one of buffer units located at a predetermined height position in a substrate buffer to another of the buffer units located at a different height position in the substrate buffer. Accordingly, the interface layer is accessible to the buffer unit located at a height position corresponding to the interface layer. Thus, the interface layer can be made compact. Moreover, the interface layer is located in the upper part or the lower part of the developing-treatment layer, leading to reduction in footprint.

4 Claims, 16 Drawing Sheets

(51) Int. Cl.
  *H01L 21/677* (2006.01)
  *H01L 27/118* (2006.01)
  *H01L 27/146* (2006.01)
  *H01L 27/32* (2006.01)
  *H10K 59/124* (2023.01)

(56) References Cited

U.S. PATENT DOCUMENTS

| | | | |
|---|---|---|---|
| 2006/0291854 A1 | 12/2006 | Kaneyama et al. | 396/604 |
| 2007/0056514 A1* | 3/2007 | Akimoto | H01L 21/67184 |
| | | | 118/716 |
| 2009/0165712 A1 | 7/2009 | Ogura et al. | 118/695 |
| 2009/0165950 A1 | 7/2009 | Kim et al. | 156/345.1 |
| 2010/0021621 A1* | 1/2010 | Hayashida | H01L 21/67178 |
| | | | 118/712 |
| 2014/0126980 A1* | 5/2014 | Wamura | H01L 21/67184 |
| | | | 414/221 |
| 2014/0161983 A1 | 6/2014 | Inagaki | 427/402 |
| 2014/0285790 A1 | 9/2014 | Nishiyama | 355/72 |
| 2015/0255270 A1 | 9/2015 | Ku et al. | |
| 2016/0293459 A1 | 10/2016 | Cha et al. | |
| 2017/0133255 A1* | 5/2017 | Aguilar | H01L 21/67736 |

FOREIGN PATENT DOCUMENTS

| | | |
|---|---|---|
| JP | H11-087459 A | 3/1999 |
| JP | 2007-005660 A | 1/2007 |
| JP | 2010-034566 A | 2/2010 |
| JP | 2014-093489 A | 5/2014 |
| JP | 2014-116508 A | 6/2014 |
| JP | 2014-187273 A | 10/2014 |
| JP | 2016-201526 A | 12/2016 |
| KR | 10-2006-0088495 A | 8/2006 |
| KR | 10-1052946 B1 | 7/2011 |
| KR | 10-1541836 B1 | 8/2015 |
| KR | 10-2016-0119380 A | 10/2016 |
| TW | 201036092 A | 10/2010 |

OTHER PUBLICATIONS

Notice of Allowance dated Aug. 9, 2021 for corresponding Taiwan Patent Application No. 109141285.
Notice of Allowance dated May 30, 2023 for corresponding Japanese Patent Application No. 2019-214462.

* cited by examiner

SUBSTRATE TREATING APPARATUS AND SUBSTRATE TRANSPORTING METHOD

CROSS-REFERENCE TO RELATED APPLICATIONS

This application claims priority to Japanese Patent Application No. 2019-214462 filed Nov. 27, 2019, the subject matter of which is incorporated herein by reference in entirety.

TECHNICAL FIELD

The present invention relates to a substrate treating apparatus for performing treatment on substrates and a substrate transporting method for the substrate treating apparatus. Examples of substrates include semiconductor substrates, substrates for flat panel displays (FPDs), glass substrates for photomasks, substrates for optical disks, substrates for magnetic disks, ceramic substrates, and substrates for solar cells. Examples of the FPDs include liquid crystal display devices and organic electroluminescence (EL) display devices.

DESCRIPTION OF THE RELATED ART

A currently-used substrate treating apparatus includes an indexer block, a coating block, a developing block, and an interface block in this order (See, for example, Japanese Unexamined Patent Application Publication No. 2014-187273A). Hereinafter, the indexer block is referred to as an "ID block", where appropriate, and the interface block is referred to an "IF block", where appropriate.

The ID block includes a carrier platform and a substrate transport mechanism. The substrate transport mechanism takes a substrate from a carrier placed on the carrier platform, and transports the substrate to a coating block. The coating block forms a photoresist film, for example, on the substrate. The substrate on which the photoresist film is formed is transported through a developing block to the IF block. The IF block loads and unloads the substrate into and from an exposure device.

The substrate subjected to an exposure treatment is transported through the IF block to a developing block. The developing block performs a developing treatment on the substrate subjected to the exposure treatment. The substrate subjected to the developing treatment is transported through the coating block to the ID block. The substrate transport mechanism of the ID block returns the substrate, subjected to the developing treatment, to the carrier on the platform. Here, the coating block and the developing block each include two treatment layers.

Moreover, Japanese Unexamined Patent Application Publication No. H09-045613A discloses a substrate treating apparatus that includes a coating-treatment block, a cassette station (corresponding to an ID block), and a developing-treatment block arranged in this order. The cassette station is configured so that four cassettes containing either an untreated substrate or a treated substrate can be arranged therein. In addition, a first substrate platform for alignment of the substrate is provided at a boundary between the coating-treatment block and the cassette station, and a second substrate platform for alignment of the substrate is provided at a boundary between the cassette station and the developing-treatment block. Here, each of the blocks does not consist of a plurality of treatment layers arranged in an up-down direction but a single treatment layer.

SUMMARY OF THE INVENTION

Technical Problem

However, the currently-used apparatus possesses the following problem. The currently-used apparatus includes the IF block provided with a first substrate transport mechanism and two second substrate transport mechanisms. The first substrate transport mechanism actually transports substrates to the exposure device. The second substrate transport mechanisms are provided between the developing block adjacent to the IF block and the first substrate transport mechanism. The second substrate transport mechanisms transport substrates to the first substrate transport mechanism via the substrate platform, for example. Moreover, the second substrate transport mechanisms move upward/downward between the two treatment layers of the developing block arranged in the up-down direction to receive substrates W from the two treatment layers and to distribute the substrates to the two treatment layers. That is, the IF block includes, in addition to the first substrate transport mechanism, the two second substrate transport mechanisms having the function of moving upward/downward between the two treatment layers. Accordingly, the IF block becomes large.

The present invention has been made regarding the state of the art noted above, and its object is to provide a substrate treating apparatus and a substrate transporting method that achieve a compact interface construction.

Solution to Problem

To achieve the object, the present invention provides a configuration as follows. A substrate treating apparatus according to one aspect of the present invention includes an indexer block, a first treating block, and a second treating block. The indexer block is provided with a carrier platform for placing a carrier capable of accommodating substrates. The indexer block includes a substrate buffer and an indexer mechanism. The substrate buffer includes a plurality of buffer units where the substrates are placed. The indexer mechanism transports the substrates. The first treating block includes an interface layer and a first treatment layer. The interface layer loads and unloads the substrates into and from an external device. The first treatment layer is located on an upper part or a lower part of the interface layer. The second treating block includes a plurality of second treatment layers arranged in an up-down direction. The first treating block, the indexer block, and the second treating block are connected in a horizontal direction in this order. The indexer mechanism transports a substrate between the carrier placed on the carrier platform and the substrate buffer. The indexer mechanism transports the substrate from one of the buffer units in the substrate buffer located at a predetermined height position to another of the buffer units in the substrate buffer located at a different height position. The plurality of second treatment layers receive and deliver the substrates from and to the buffer units in the substrate buffer, respectively, the buffer units located at height positions corresponding to the second treatment layers, respectively. The interface layer at least receives the substrate from the buffer unit in the substrate buffer, the buffer unit being located at a height position corresponding to the interface layer. The first treatment layer at least delivers the substrate to the buffer unit in the substrate buffer, the buffer unit being located at a height position corresponding to the first treatment layer.

According to the substrate treating apparatus of the present invention, the first treating block includes the first treatment layer and the interface layer arranged in the up-down direction. Accordingly, the interface layer is couplable with the indexer block. Moreover, the indexer mechanism of the indexer block transports the substrate from one of the buffer units located at a predetermined height position in the substrate buffer to another of the buffer units located at a different height position in the substrate buffer. Accordingly, the interface layer is accessible to the buffer unit located at a height position corresponding to the interface layer. Thus, the interface layer can be made compact. Moreover, the interface layer is located in the upper part or the lower part of the first treatment layer, leading to reduction in footprint.

Moreover, in one example of the substrate treating apparatus described above, the first treatment layer is a developing-treatment layer, the second treatment layers are each a coating-treatment layer, and the external device is an exposure device. In this case, the interface layer can be made compact. Moreover, reduction in footprint is obtainable.

Moreover, the substrate treating apparatus described above is preferably configured as under. The interface layer includes a treating area coupled with the indexer block and an interface area coupled with the treating area. The treating area includes an exposure-related treating unit configured to perform a predetermined treatment to the substrate after the coating treatment and before the developing treatment, and a transport mechanism configured to transport the substrate among the substrate buffer of the indexer block, the exposure-related treating unit, and the interface area. The interface area includes a transport mechanism for an exposure device configured to transport a substrate between the exposure device and the treating area.

The exposure-related treating unit is provided in the interface layer. Accordingly, the number of the exposure-related treating units provided in other processing layers is suppressible. As a result, the other treatment layers can include a treating unit except for the exposure-related treating unit.

It is preferred in the substrate treating apparatus described above that the interface area is located such that an end portion thereof adjacent to the exposure device protrudes outward of the first treatment layer. This can form an air layer between the exposure device and the substrate treating apparatus. Thus, when thermal of the substrate treating apparatus may affect the exposure device, the air layer can block the thermal.

Moreover, it is preferred in the substrate treating apparatus described above that the interface area is located such that an end portion thereof adjacent to the exposure device is accommodated within the first treatment layer. This achieves reduction in footprint of the substrate treating apparatus.

Moreover, the substrate treating apparatus described above is preferably configured as under. The interface area includes a substrate platform configured to place the substrates thereon. The first treating block includes a transportation space extending in the up-down direction from the treating area of the interface layer to the first treatment layer, and an interlayer transport mechanism located in the transportation space. The first treatment layer includes an adjacent treating unit located adjacent to the transportation space. The interlayer transport mechanism receives a substrate from the substrate platform of the interface area, and transports the substrate directly to the adjacent treating unit of the first treatment layer.

There may need much time to transport a substrate from the interface layer to the indexer block, and further from the indexer block to the first treatment layer. Moreover, a large load may possibly be applied to the transport mechanism of the interface layer. With the present invention, the substrate can be transported directly to the adjacent treating unit of the first treatment layer without through the indexer block. Accordingly, a substrate can be transported rapidly to the first treatment layer and also the load on the transport mechanism of the interface layer can be reduced. Moreover, the transportation space where the interlayer transport mechanism is located is provided not only in the interface layer but also in an area of the first treatment layer. Thus, the interface layer can be kept compact.

It is preferred in the substrate treating apparatus described above that the treating area includes an adjacent treating unit as the exposure-related treating unit that is located adjacent to the interface area, and the transport mechanism for the exposure device transports the substrate, subjected to the exposure treatment, to the adjacent treating unit of the treating area directly. When a substrate is transported in the interface layer from the interface area to the treating area via the buffer unit, for example, the transport mechanism in the treating area has to transport the substrate from the buffer unit to the adjacent treating unit. With the present invention, the transport mechanism for the exposure device can transport the substrate, subjected to the exposure treatment, to the adjacent treating unit without through the buffer unit. Accordingly, the load applied to the transport mechanism in the treating area for substrate transportation can be reduced.

It is preferred that the substrate treating apparatus described above further includes a carrier storage shelf configured to store the carrier, and a carrier transport mechanism configured to transport the carrier between the carrier platform and the carrier storage shelf, the second treating block is lower in level than the first treating block, and the carrier storage shelf and the carrier transport mechanism are mounted on the second treating block. This can suppress a height of the substrate treating apparatus.

Another aspect of the present invention provides a substrate transporting method for a substrate treating apparatus. The substrate treating apparatus includes an indexer block, a first treating block, and a second treating block. The indexer block is provided with a carrier platform for placing a carrier capable of accommodating substrates. The indexer block includes a substrate buffer and an indexer mechanism. The substrate buffer includes a plurality of buffer units where the substrates are placed. The indexer mechanism transports the substrates. The first treating block includes a first treatment layer. The second treating block includes a plurality of second treatment layers arranged in an up-down direction. The first treating block, the indexer block, and the second treating block are connected in a horizontal direction in this order. The substrate transporting method for the substrate treating apparatus includes a first transportation step of transporting a substrate by the indexer mechanism between the carrier on the carrier platform and the substrate buffer, a second transporting step of transporting a substrate by the indexer mechanism from one of the buffer units located at a predetermined height position in the substrate buffer to another of the buffer units located at a different height position in the substrate buffer, a receiving and delivering step of receiving and delivering the substrates by the plurality of second treatment layers from and to the buffer units in the substrate buffer, respectively, the buffer units being located at height positions corresponding to the second treatment layers, respectively, a receiving step of at least receiving the substrate by an interface layer, located in an upper part or a lower part of the first treatment layer, from the buffer unit located in the substrate buffer at a height position corresponding to the interface layer, a delivering step of at least delivering the substrate by the first treatment layer to the buffer unit located in the substrate buffer at a height position corresponding to the first treatment layers, and a loading and unloading step of loading and unloading a substrate by the interface layer into and from an external device.

According to the substrate transporting method of the present invention, the first treating block includes the first treatment layer and the interface layer arranged in the up-down direction. Accordingly, the interface layer is couplable with the indexer block. Moreover, the indexer mechanism of the indexer block transports the substrate from one of the buffer units located at a predetermined height position in the substrate buffer to another of the buffer units located at a different height position in the substrate buffer. Accordingly, the interface layer is accessible to the buffer unit located at a height position corresponding to the interface layer. Thus, the interface layer can be made compact. Moreover, the interface layer is located in the upper part or the lower part of the first treatment layer, leading to reduction in footprint.

Advantageous Effects of Invention

The substrate treating apparatus and the substrate transporting method according to the present invention achieve a compact interface construction.

BRIEF DESCRIPTION OF DRAWINGS

For the purpose of illustrating the invention, there are shown in the drawings several forms which are presently preferred, it being understood, however, that the invention is not limited to the precise arrangement and instrumentalities shown.

FIRST EMBODIMENT

Figure 1:
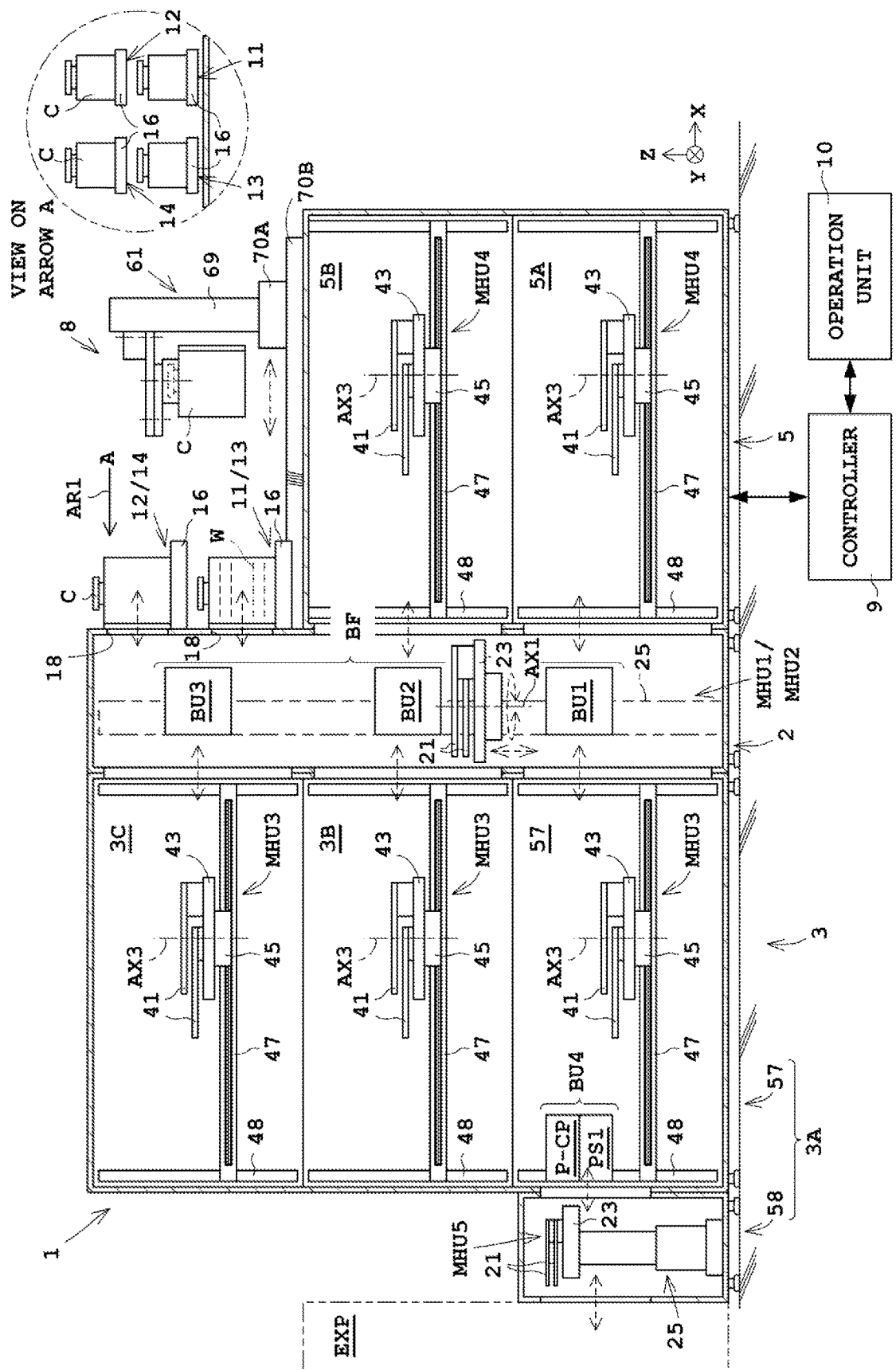
FIG. 1 is a longitudinal cross-sectional view of a substrate treating apparatus according to a first embodiment.

A first embodiment of the present invention will now be described with reference to the drawings. FIG. 1 is a longitudinal cross-sectional view of a substrate treating apparatus 1 according to a first embodiment.

1. Configuration of Substrate Treating Apparatus 1

Reference is made to FIG. 1. The substrate treating apparatus 1 includes an ID block 2, a first treating block 3, a second treating block 5, and a carrier buffer device 8. The first treating block 3, the ID block 2, and the second treating block 5 are linearly connected in the horizontal direction in this order.

Moreover, the substrate treating apparatus 1 includes a controller 9 and an operation unit 10. The controller 9 includes, for example, a central processing unit (CPU). The controller 9 controls components of the substrate treating apparatus 1. The operation unit 10 includes a display unit (e.g., liquid crystal monitor), a memory unit, and an input unit. The memory unit includes, for example, at least one of a read-only memory (ROM), a random-access memory (RAM), and a hard disk. The input unit includes at least one of a keyboard, a mouse, a touch panel, and various buttons. The memory unit stores conditions for substrate treatments and operation programs necessary for controlling the substrate treating apparatus 1.

(1-1) Configuration of ID Block 2

The ID block 2 includes four openers 11 to 14 (see FIGS. 1 and 2), and two substrate transport mechanisms (robots) MHU1 and MHU2, and a substrate buffer BF. The two substrate transport mechanisms MHU1, MHU2, and the substrate buffer BF are located inside the ID block 2. Here, each of the two substrate transport mechanisms MHU1, MHU2 corresponds to the indexer mechanism of the present invention.

(1-1-1) Configurations of Four Openers 11 to 14

The four openers 11 to 14 are provided on an outer wall of the ID block 2. The two openers 11 and 12 are located in an up-down direction. Likewise, the two openers 13 and 14 are located in the up-down direction. Each of the four openers 11 to 14 includes a platform 16, an opening 18, a shutter member (not shown), and a shutter member driving mechanism (not shown), as shown in FIG. 1. The platform 16 is used to place a carrier C. The platform 16 corresponds to the carrier platform of the present invention. Here, FIG. 1 illustrates in its circular frame the openers 11 to 14, located in two levels in the up-down direction×two lines in a horizontal direction, when seen from an arrow AR1.

The carrier C can accommodate a plurality of (e.g., 25) substrates W. For instance, a FOUP (Front Open Unified Pod) or SMIF (Standard Mechanical Inter Face) pod is used as the carrier C. For the carrier C, such a carrier is used for example, that includes a carrier body and a lid for covering the opening of the carrier body. The carrier body is provided with an opening provided therein through which the substrates W are inserted or taken out, and is configured to accommodate the substrates W.

The opening 18 is used to pass thorough the substrate W. The shutter member opens and closes the opening 18, and attaches and detaches the lid to and from the carrier body of the carrier C. The shutter member driving mechanism includes an electric motor to drive the shutter member. After removing the lid from the carrier body, the shutter member is moved horizontally (Y direction) or downward (Z direction) along the opening 18, for example.

The platform 16 is located above the second treating block 5. That is, the platforms 16 of the four openers 11 to 14 are located above the second treating block 5. Moreover, the lower two platforms 16 may be provided on an upper face or a roof of the second treating block 5.

(1-1-2) Configuration of Substrate Transport Mechanisms MHU1, MHU2

Figure 2:
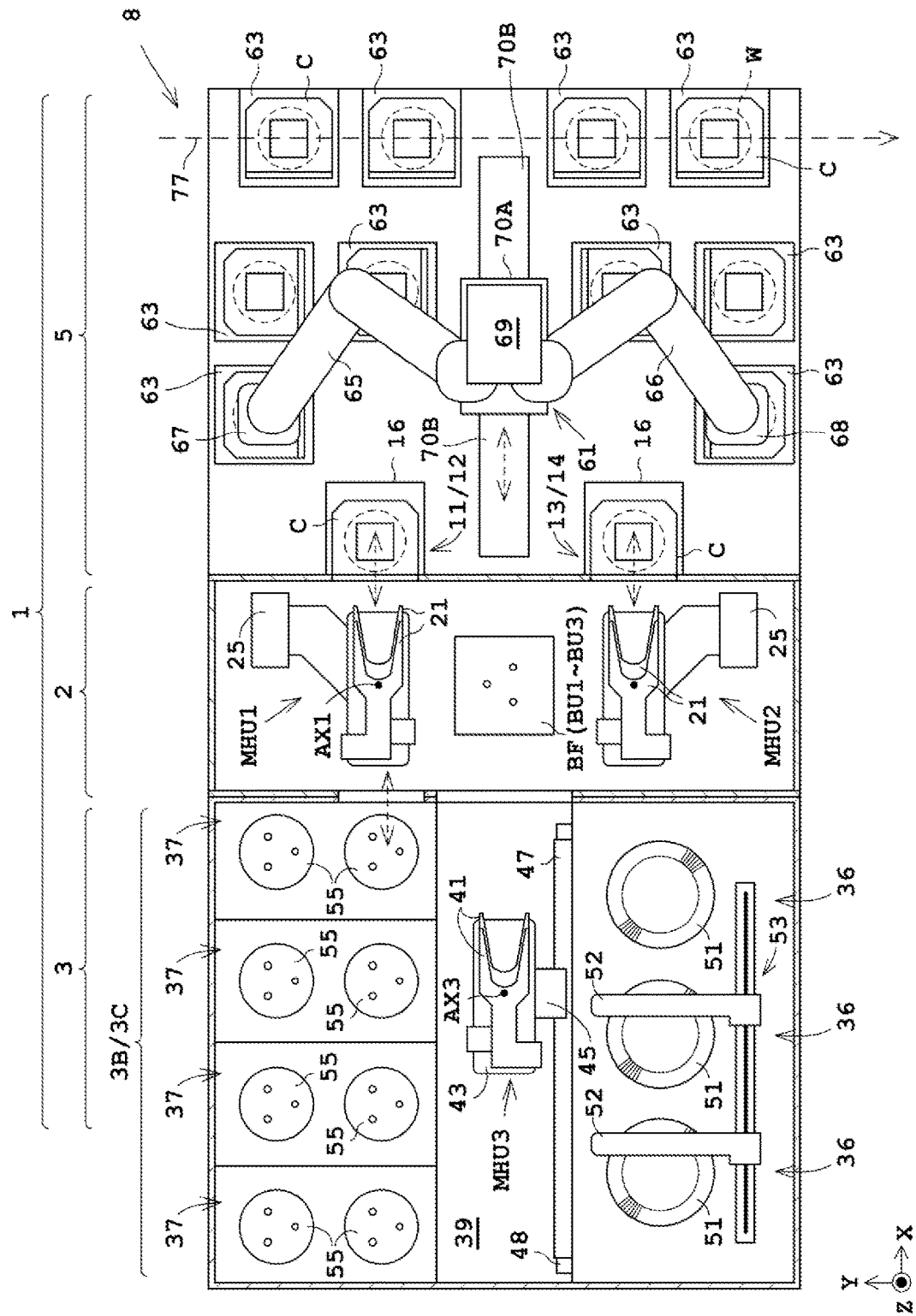
FIG. 2 is a plan view of the substrate treating apparatus where a developing-treatment layer in an upper layer and an intermediate layer is shown in a horizontal cross-sectional view.

As shown in FIG. 2, the two substrate transport mechanisms MHU1, MHU2 are located across the substrate buffer BF. In addition, the two substrate transport mechanisms MHU1, MHU2 are located in a direction (Y direction) perpendicular to the direction (X direction) in which the first treating block 3 and the second treating block 5 are arranged side by side.

The first substrate transport mechanism MHU1 can transport a substrate W between the carriers C placed on the platforms 16 of the two openers 11 and 12 and the substrate buffer BF. The second substrate transport mechanism MHU2 can transport a substrate W between the carriers C placed on the platforms 16 of the two openers 13 and 14 and the substrate buffer BF.

Figure 3:
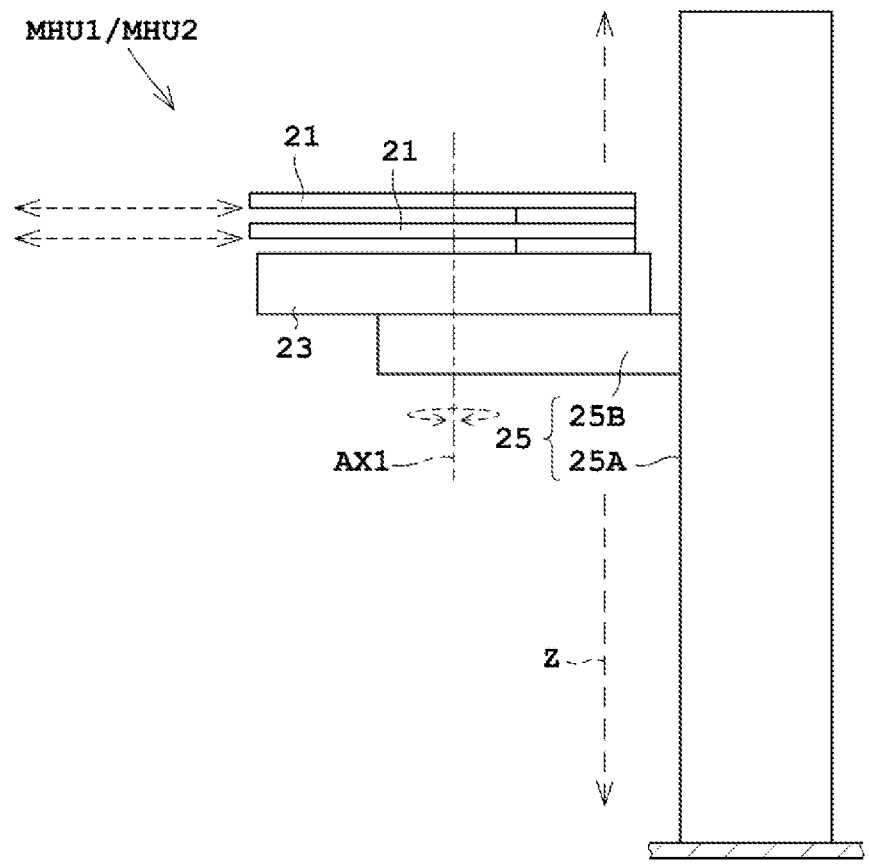
FIG. 3 illustrates a substrate transport mechanism of the indexer block.
Figure 4:
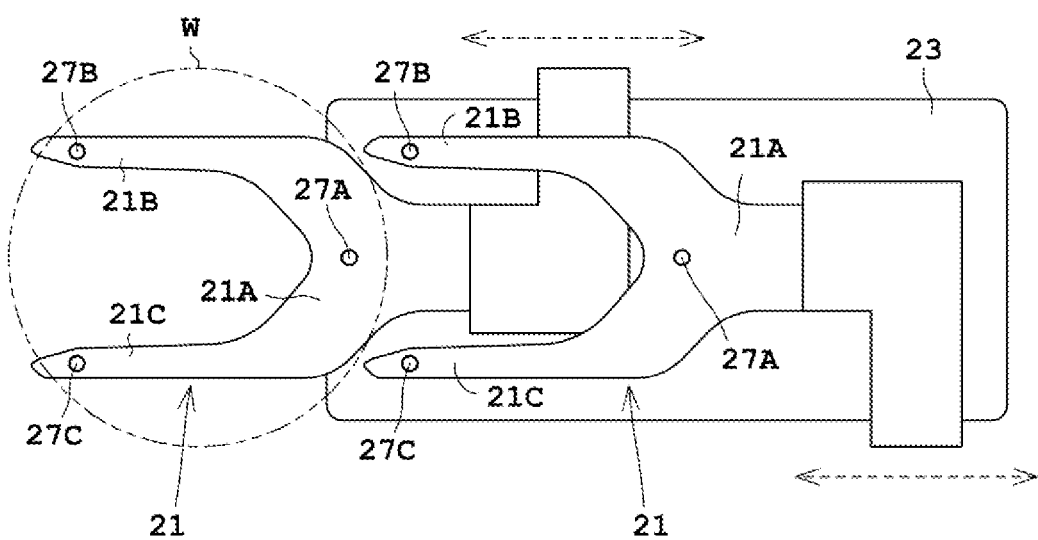
FIG. 4 is a plan view of two hands and a forward/rearward driving unit.

Reference is made to FIGS. 3 and 4. The two substrate transport mechanisms MHU1, MHU2 each includes two hands 21, a forward/rearward driving unit 23, and a lifting/lowering rotation driving unit 25. The two hands 21 each hold a substrate W. The two hands 21 are movable forward and backward in the horizontal direction individually. Therefore, it is possible to take out one substrate W from the carrier C, or take out two substrates W at the same time.

As shown in FIG. 4, the hand 21 includes one basic part 21A, and two tip parts 21B, 21C branched from the basic part 21A. The hand 21 is formed in a Y-shape, a U-shape, or a two-pronged fork shape. Suction portions 27A, 27B, and 27C for holding a substrate W by sucking the substrate W are provided on the basic part 21A and the two tip parts 21B, 21C, respectively. Each of the three suction portions 27A to 27C is configured so that a suction force is applied by a pump connected through a pipe, for example. Here, each of the two substrate transport mechanisms MHU1, MHU2 includes two hands 21, but may include three or more hands 21.

The forward/rearward driving unit 23 supports each of the hands 21 movably, and moves each of the hands 21 forward and rearward. In order to drive one hand 21, the forward/rearward driving unit 23 includes, for example, an electric motor, a linear screw shaft configured to rotate axially by the electric motor, a movable member having a hole portion engaging with the screw shaft, and a guide portion for guiding the movable member.

The lifting/lowering rotation driving unit 25 lifts, lowers, and rotates the forward/rearward driving unit 23 to thereby lift, lower, and rotate the two hands 21. As shown in FIG. 3, the lifting/lowering rotation driving unit 25 includes a strut portion 25A and a rotating portion 25B. The strut portion 25A extends in the up-down direction. The strut portion 25A is fixed to the floor of the ID block 2. Accordingly, the position of the strut portion 25A (i.e., the lifting/lowering rotation driving unit 25) in the horizontal direction (XY direction) is fixed without being moved. The rotating portion 25B rotates forward/rearward driving unit 23 around a vertical axis AX1. An electric motor causes the lifting/lowering rotation driving unit 25 to perform the lifting, lowering, and rotating.

(1-1-3) Configuration of Substrate Buffer BF

Figure 5:
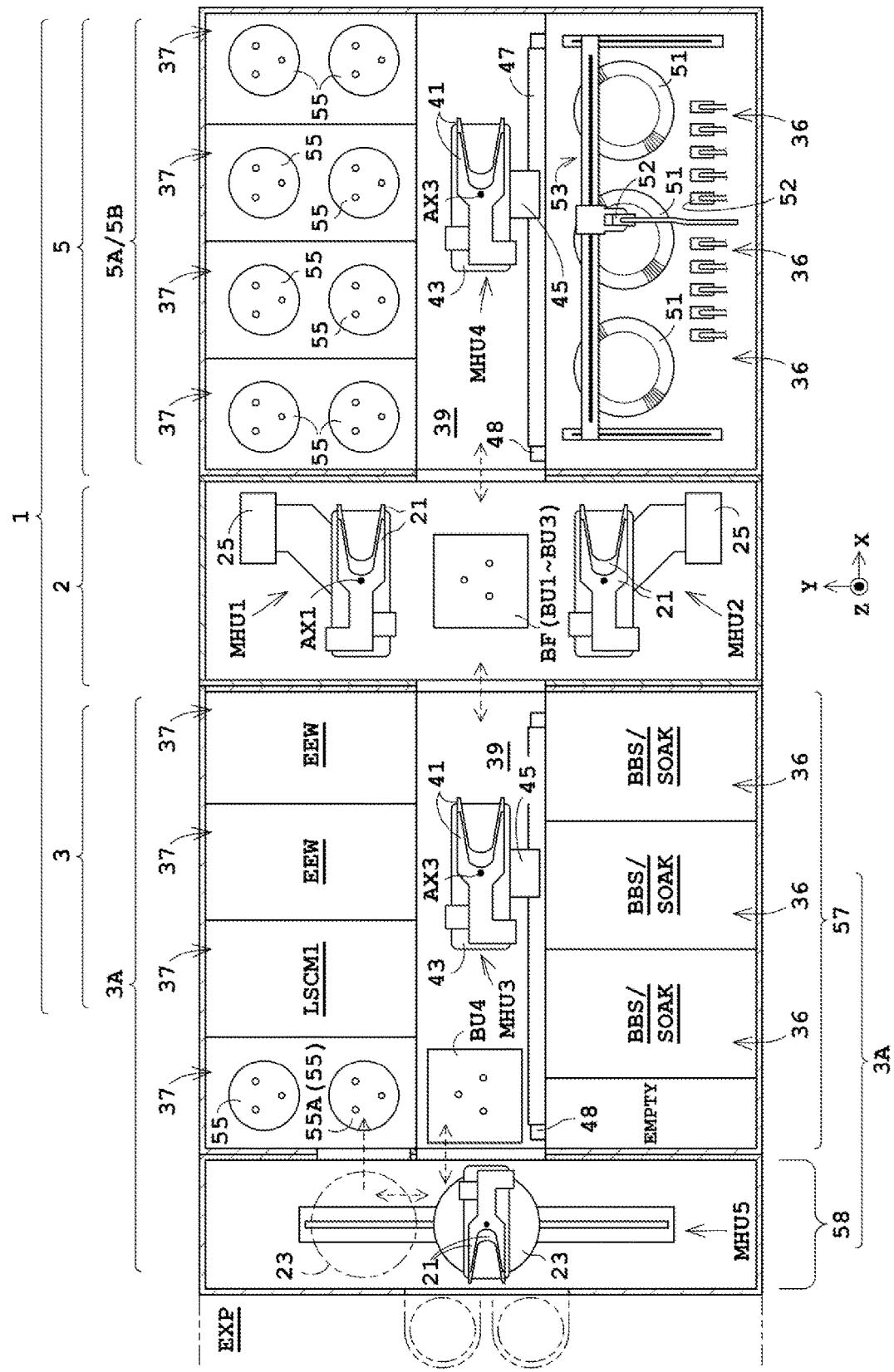
FIG. 5 is a horizontal cross-sectional view of an interface layer in a lower layer and a coating-treatment layer in an intermediate layer and a lower layer.

Reference is made to FIGS. 1, 2 and 5. The substrate buffer BF places a plurality of substrates W thereon. As shown in FIG. 5, the substrate buffer BF is located in the middle (center) of the first treating block 3 and the second treating block 5. Accordingly, not only the two substrate transport mechanisms MHU1 and MHU2 but also the substrate transport mechanism MHU3 of the first treating block 3 and the substrate transport mechanism MHU4 of the second treating block 5 are capable of loading and unloading the substrates W to the substrate buffer BF. That is, the four substrate transport mechanisms MHU1 to MHU4 can take the substrates W, placed on the substrate buffer BF, from four directions.

The substrate buffer BF includes three buffer units BU1 to BU3, as shown in FIG. 1. The three buffer units BU1 to BU3 are located in a row in the up-down direction. Each of the three buffer units BU1 to BU3 includes a plurality of (e.g., 15) substrate platforms (not shown) located in the up-down direction for placing the substrates W.

The first buffer unit BU1 is provided in the same stage as an interface layer 3A of the first treating block 3 and a coating-treatment layer 5A of the second treating block 5 (i.e., lower layer or first floor). The second buffer unit BU2 is provided in the same stage as a treatment layer 3B of the first treating block 3 and a treatment layer 5B of the second treating block 5 (i.e., intermediate layer or second floor). The third buffer unit BU3 is provided in the same stage as a treatment layer 3C of the first treating block 3 and the carrier buffer device 8 (i.e., upper layer or third floor). For instance, the interface layer 3A is located at a different stage from the coating-treatment layer 5B in the intermediate layer.

(1-2) Configuration of Treating Blocks 3, 5

Reference is made to FIG. 1. The first treating block 3 includes three treatment layers 3A, 3B, and 3C. The treatment layer 3A of the three treatment layers 3A to 3C corresponds to the interface layer as the feature of the present invention. The other treatment layers 3B and 3C each correspond to the developing-treatment layer. On the other hand, the second treating block 5 includes two coating-treatment layers 5A and 5B. Hereinafter, the interface layer 3A is referred to as an "IF layer 3A", where appropriate. The detail of the IF layer 3A is to be mentioned later.

The three treatment layers 3A to 3C of the first treating block 3 are located in the up-down direction in a stacked manner. The two treatment layers 5A and 5B of the second treating block 5 are also located in the up-down direction in a stacked manner. The two coating-treatment layers 5A and 5B each perform a coating treatment on the substrate W. The two developing-treatment layers 3B and 3C each perform a developing treatment on the substrate W. The IF layer 3A loads and unloads the substrate W into and from an exposure device EXP as an external device.

The two developing-treatment layers 3B and 3C each include the third substrate transport mechanism MHU3, a plurality of liquid treating units 36, a plurality of heat treating units 37, and a transportation space 39 (see FIG. 2). The two coating-treatment layers 5A and 5B each include the fourth substrate transport mechanism MHU4, a plurality of liquid treating units 36, a plurality of heat treating units 37, and a transportation space 39 (see FIG. 5). The transportation space 39 is a longitudinal rectangular space in the X-direction in plan view. The substrate transport mechanism MHU3 or MHU4 is located in the transportation spaces 39. The liquid treating units 36 and the heat treating units 37 are arranged across the transportation space 39. Moreover, the liquid treating units 36 and the heat treating units 37 are each located along the longitudinal direction of the transportation space 39 (X-direction).

(1-2-1) Configuration of Substrate Transport Mechanisms MHU3, MHU4

The substrate transport mechanisms MHU3, MHU4 each transport the substrate W. As shown in FIG. 1. The substrate transport mechanisms MHU3, MHU4 each include two hands 41, a forward/rearward driving unit 43, a rotation driving unit 45, a first movement mechanism 47, and a second movement mechanism 48. The two hands 41, the forward/rearward driving unit 43 and the rotation driving unit 45 are configured in the same manner as the two hands 21, the forward/rearward driving unit 23, and the rotating portion 25B of the first substrate transport mechanism MHU1, respectively, for example (see FIGS. 3 and 4).

The two hands 41 are each movably attached to the forward/rearward driving unit 43. The forward/rearward driving unit 43 moves the two hands 41 forward and rearward individually. The rotation driving unit 45 rotates the forward/rearward driving unit 43 around a vertical axis AX3. This can change orientation of the two hands 41. The first movement mechanism 47 can move the rotation driving unit 45 in the front-back direction (X-direction) of FIG. 1. The second movement mechanism 48 can move the first movement mechanism 47 in the up-down direction (Z-direction) of FIG. 1. The two movement mechanisms 47, 48 allow the two hands 41 and the forward/rearward driving unit 43 to move in the X-Z direction.

The forward/rearward driving unit 43, the rotation driving unit 45, the first movement mechanism 47 and the second movement mechanism 48 each include an electric motor.

(1-2-2) Configuration of Liquid Treating Unit 36

Figure 6:
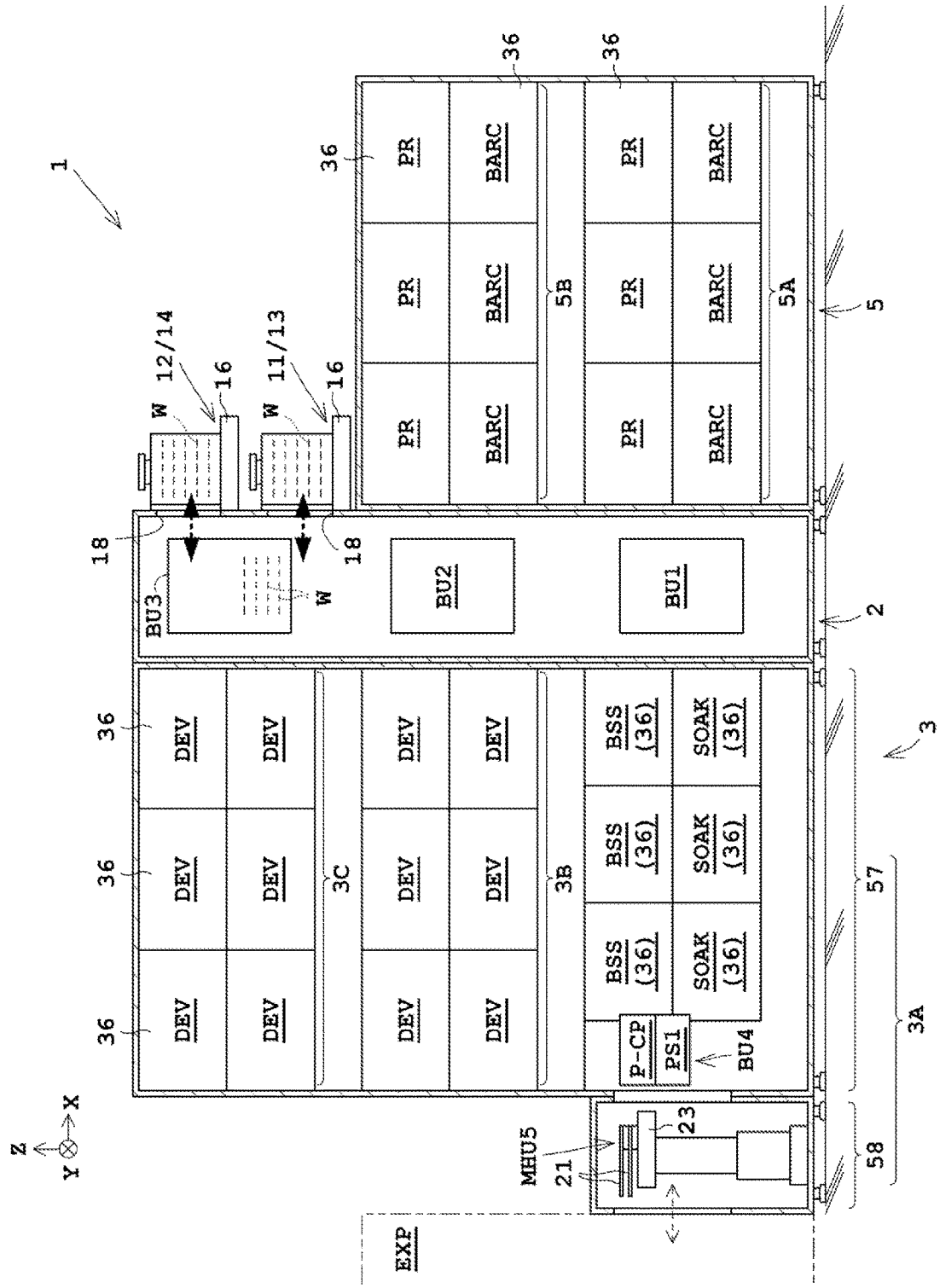
FIG. 6 is a right side view of the substrate treating apparatus.

FIG. 6 is a right side view of the substrate treating apparatus 1. Each of the five treatment layers 3A to 3C, 5A and 5B includes six liquid-treating units 36. The six liquid treating units 36 can be located in two levels in the up-down direction×three lines in the horizontal direction. In FIG. 6, the two coating-treatment layers 5A and 5B each include three coating units BARC and three coating units PR, for example. The two developing-treatment layers 3B and 3C each include six developing units DEV. Note that the number and types of the liquid treating units 36 (containing liquid treating units 36 of the IF layer 3A) are variable as required.

Reference is made to FIGS. 2 and 5. The liquid treating units 36 (the coating units BARC, PR and the developing unit DEV) each include a holding rotation portion 51, nozzles 52 and a nozzle moving mechanism 53. The holding rotation portion 51 holds a back face of a substrate W by, for example, vacuum adsorption, and rotates the held substrate W around the vertical axis (Z direction). The nozzles 52 dispense a treating liquid (for example, a liquid for forming an antireflection film, a photoresist liquid, or a developer) to the substrate W. The nozzles 52 is connected to a treating liquid supply source via pipes, respectively, and the pipes are each provided with a pump and an on-off valve. The nozzle moving mechanism 53 moves the nozzles 52 to any positions. The holding rotation portion 51 and the nozzle moving mechanism 53 each include an electric motor, for example.

(1-2-3) Configuration of Heat Treating Unit 37 (and Other Treating Units)

Figure 7:
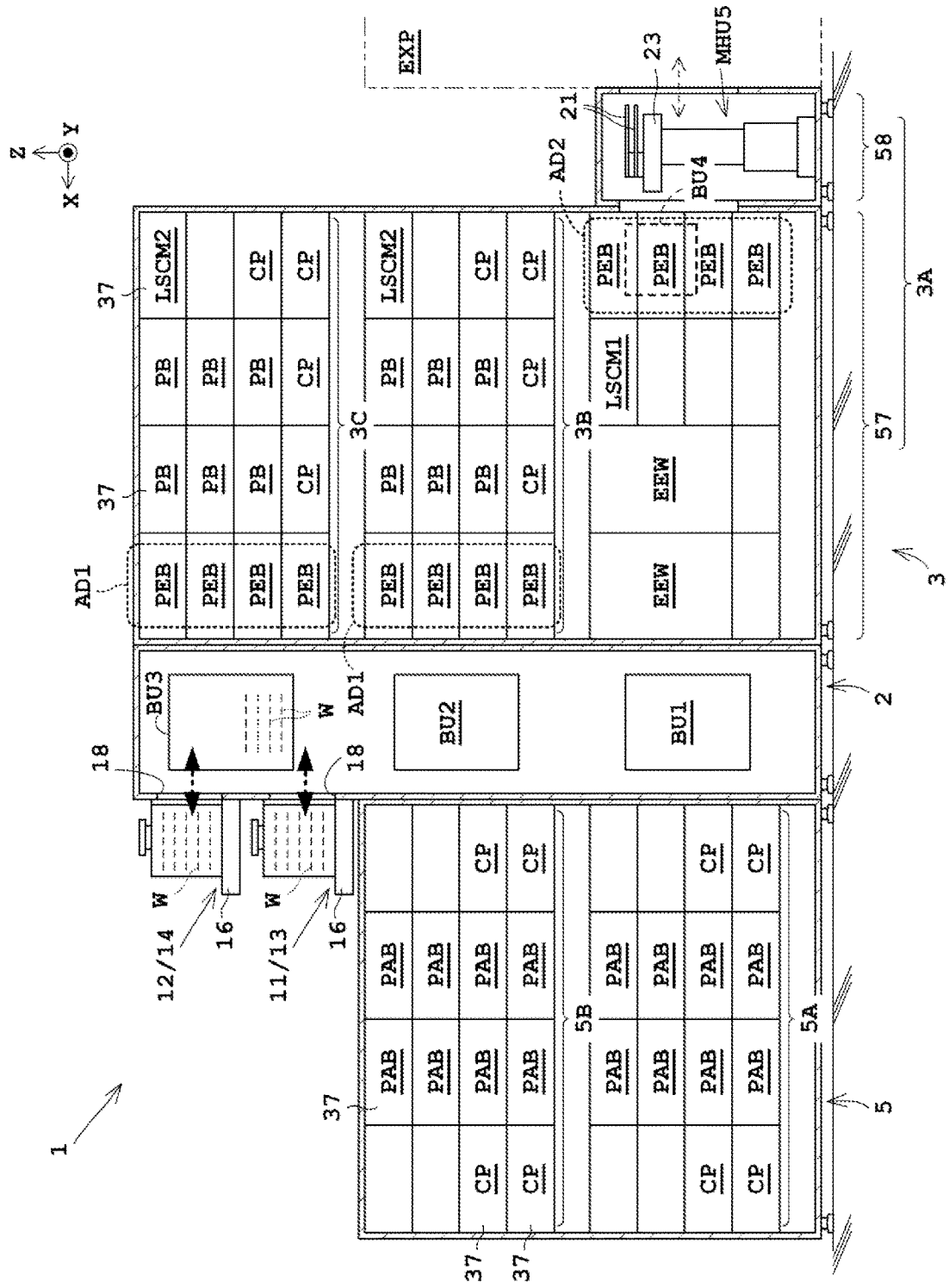
FIG. 7 is a left side view of the substrate treating apparatus.

FIG. 7 is a left side view of the substrate treating apparatus 1. Each of the five treatment layers 3A to 3C, 5A and 5B may include sixteen heat treating units 37. The sixteen heat treating units 37 are located in 4 levels×4 lines. The heat treating units 37 each include a plate 55 (see FIGS. 2 and 5) configured to place the substrate W thereon and perform a heat treatment to the substrate W. The heat treating units 37 each include a heater, such as an electric heater, when heating the plate 55. Moreover, the heat treating units 37 also include, for example, a water-cooled circulation mechanism or a Peltier element when cooling the plate 55. The number, types, and positions of the heat treating units 37 are appropriately variable.

In FIG. 7, each of the two coating-treatment layers 5A and 5B includes four cooling units CP and eight heat treating units PAB, for example. The cooling units CP each cool the substrate W. The heat treating units PAB each perform a bake treatment on the substrate W after coating. Note that the two coating-treatment layers 5A and 5B may each include an adhesion enhancing treatment unit AHP. The adhesion enhancing treatment unit AHP applies an adhesion enhancing agent, such as hexamethyldisilazane (HMDS), to substrates W and heat the substrates W.

Moreover, each of the two developing-treatment layers 3B and 3C includes four post-exposure bake treatment units PEB, four cooling units CP, six post-bake units PB, and one inspection unit LSCM2, for example. The post-exposure bake treatment units PEB each perform a baking treatment on the substrate W after an exposure. The post-bake units PB each perform a baking treatment on the substrate W after the developing treatment. The inspection unit LSCM2 and an inspection unit LSCM1 mentioned later each include a CCD-camera or an image sensor. The inspection unit LSCM2 inspects the substrate W subjected to the developing treatment. Here, the heat treating units PAB, the post-exposure bake treatment units PEB, the post-bake units PB, and the adhesion enhancing treatment units AHP each have a cooling function.

(1-2-4) Configuration of IF Layer (Interface Layer) 3A

The IF layer 3A is located below the two developing-treatment layers 3B and 3C. As shown in FIG. 5, the IF layer 3A includes a treating area 57, an interface area 58, and a buffer unit BU4 (interface buffer unit). The treating area 57 is connected to the ID block 2.

The treating area 57 is configured in the same manner as the two developing-treatment layers 3B and 3C. That is, the treating area 57 includes the substrate transport mechanism MHU3, a plurality of liquid treating units 36, a plurality of heat treating units 37, and a transportation space 39. The liquid treating unit 36 and the heat treating unit 37 provided in the treating area 57 are the exposure-related treating unit. The exposure-related treating unit is a unit for performing a predetermined treatment to the substrate W after the coating treatment and before the developing treatment. Here, the substrate transport mechanism MHU3 of the IF layer 3A corresponds to the transport mechanism in the present invention.

The treating area 57 includes, for example, three rear face cleaning units BSS and three post-exposure cleaning units SOAK as the liquid treating units 36 (see FIGS. 5 and 6). The cleaning units BSS and SOAK each include, for example, a holding rotation portion for holding the substrate W, and nozzles for dispensing the cleaning liquid to the substrate W. Moreover, the rear face cleaning units BSS each clean a rear face of the substrate W with a brush. The rear face of the substrate W is a face opposite to the face where circuit patterns are formed, for example.

Moreover, the treating area 57 includes, for example, two edge exposing units EEW, one inspection unit LSCM1, and four post-exposure bake treatment units PEB as the heat treating unit 37 and other treating units, which are denoted by the numeral 37 (see FIGS. 5 and 7). The edge exposing units EEW each perform the exposure treatment of the periphery of the substrate W. Instead of the edge exposing units EEW, a treating unit may be adopted that performs overall wafer exposure (OWE). The inspection units LSCM1 each inspect a coated film (e.g., a photoresist film).

The buffer unit BU4 includes a substrate platform PS1 and a mounting-cum-cooling unit P-CP (see FIG. 1). The substrate platform PS1 and the mounting-cum-cooling unit P-CP are located in the up-down direction. Each of the substrate platform PS1 and the mounting-cum-cooling unit P-CP places one or more substrates W thereon. In FIG. 5, the buffer unit BU4 (substrate platform PS1 and mounting-cum-cooling unit P-CP) is located in the transportation space 39 in the treating area 57 for purpose of footprint reduction. In this regard, the buffer unit BU4 may be located in the interface area 58. That is, the buffer unit BU4 is located between the treating area 57 and the interface area 58. The substrate transport mechanism MHU3 in the treating area 57 is capable of transporting a substrate W among the buffer unit BU1, the liquid treating unit 36, the heat treating unit 37, other treating units (e.g., edge exposing unit EEW), the substrate platform PS1, and the mounting-cum-cooling unit P-CP.

The interface area 58 is connected to the treating area 57. The interface area 58 includes a substrate transport mechanism MHU5. The substrate transport mechanism MHU5 transports the substrate W among the exposure device EXP, the substrate platform PS1, and the mounting-cum-cooling units P-CP. Moreover, the substrate transport mechanism MHU5 can directly transport the substrate W to any of plates 55A in the four heat treating units 37 (post-exposure bake treatment unit PEB, see FIG. 5) adjacent to the interface area 58. The substrate transport mechanism MHU5 includes two hands 21 and the like, and is configured in substantially the same manner as that of the substrate transport mechanisms MHU1 and MHU2. The substrate transport mechanism MHU5 is configured such that the lifting/lowering rotation driving unit 25 is movable horizontally in a Y-direction perpendicular to the X-direction in which the two treating blocks 3 and 5 are located, which differs from the substrate transport mechanisms MHU1 and MHU2. Here, the substrate transport mechanism MHU5 corresponds to the transport mechanism for the exposure device in the present invention.

Moreover, as shown in FIGS. 1, 6, and 7, the interface area 58 is located such that an end portion thereof adjacent to the exposure device EXP of the interface area 58 protrudes outward of the two developing-treatment layers 3B and 3C. This can form an air layer between the exposure device EXP and the substrate treating apparatus 1. Thus, when thermal of the substrate treating apparatus may affect the exposure device, the air layer can block the thermal.

(1-2-5) Configuration of Adjacent Treating Units AD1, AD2

Figure 8A:
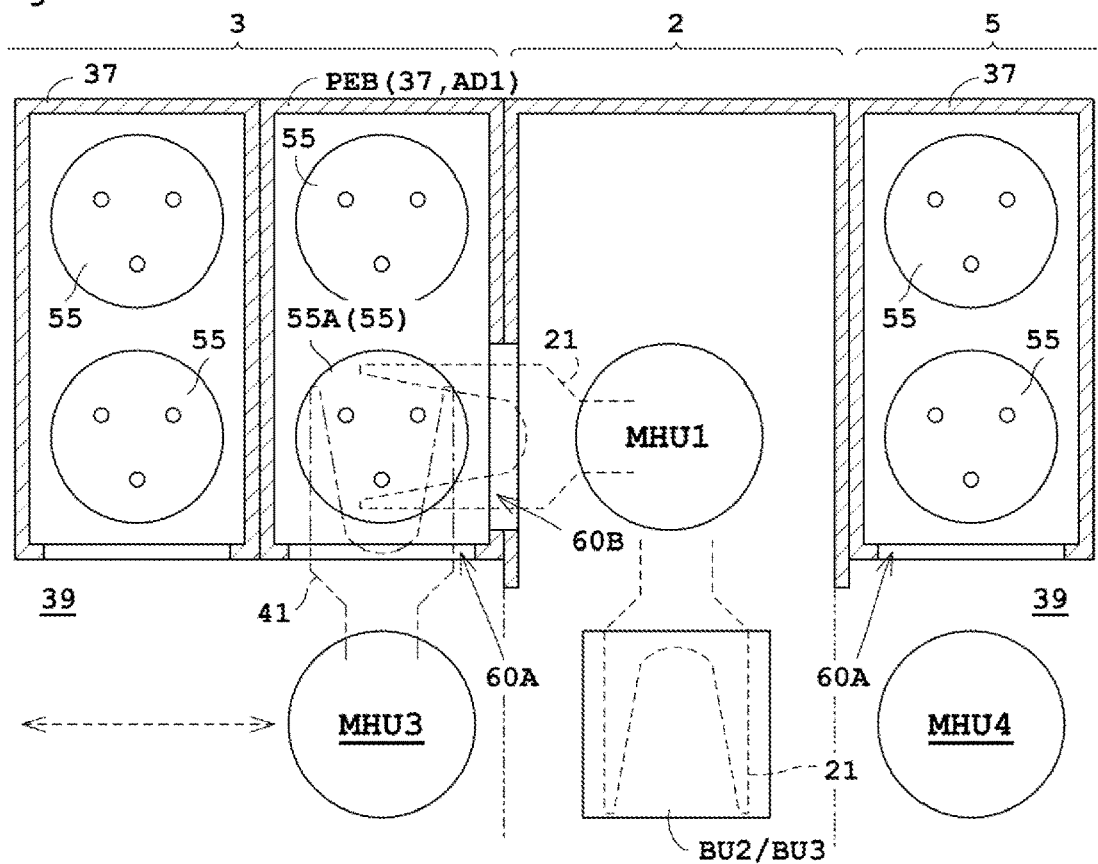
FIGS. 8A and 8B each illustrate a configuration of a heat treating unit having two substrate inlets.

Reference is made to FIG. 7. Each of the two developing-treatment layer 3B and 3C includes four post-exposure bake treatment units PEB (adjacent treating unit AD1) that are located adjacent to the ID block 2. The four post-exposure bake treatment units PEB are each provided with, for example, two substrate inlets 60A and 60B for taking the substrate W in and out from two directions, as shown in FIG. 8A. That is, the post-exposure bake treatment units PEB each include the substrate inlet 60A that is opened toward the transportation space 39 and the substrate inlet 60B that is opened toward the substrate transport mechanism MHU1 of the ID block 2.

For instance, in the developing-treatment layer 3C, the substrate transport mechanism MHU3 can deliver the substrate W to and from the plate 55A of the post-exposure bake treatment unit PEB via the substrate inlet 60A. Moreover, the substrate transport mechanism MHU1 of the ID block 2 can deliver the substrate W to and from the plate 55A of the post-exposure bake treatment unit PEB via the substrate inlet 60B.

Figure 8B:
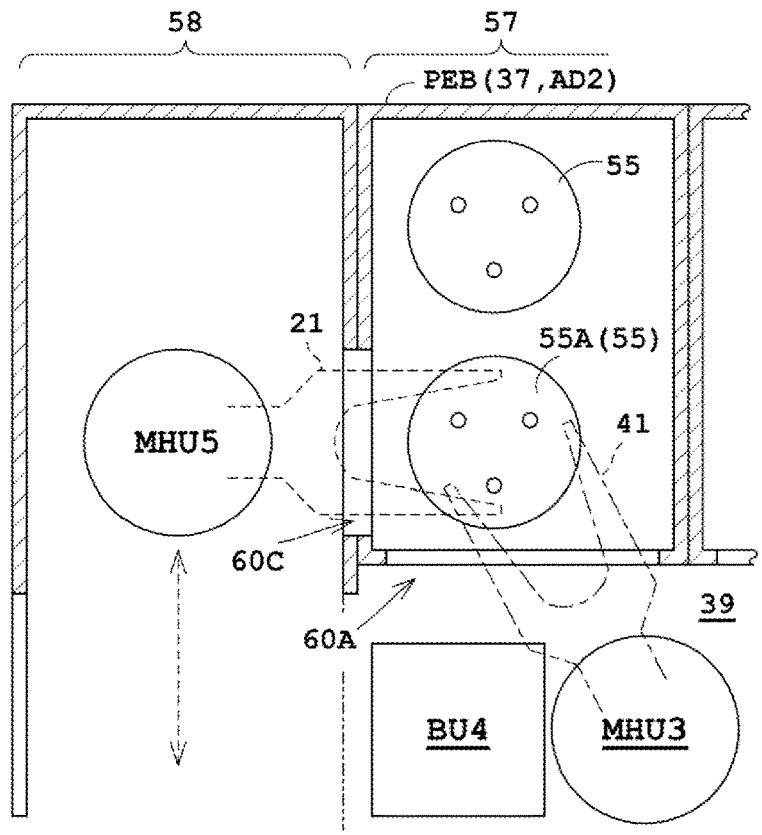

Moreover, in FIG. 7, the treating area 57 in the IF layer 3A includes four post-exposure bake treatment units PEB (adjacent treating unit AD2) that are located adjacent to the interface area 58. The four post-exposure bake treatment units PEB are each provided with, for example, two substrate inlets 60A and 60C for taking the substrate W in and out from two directions, as shown in FIG. 8B. That is, the post-exposure bake treatment units PEB each include the substrate inlet 60A that is opened toward the transportation space 39 and the substrate inlet 60C that is opened toward the substrate transport mechanism MHU5.

In the IF layer 3A, the substrate transport mechanism MHU3 can deliver the substrate W to and from the plate 55A of the post-exposure bake treatment unit PEB via the substrate inlet 60A. Moreover, the substrate transport mechanism MHU5 of the interface area 58 can deliver the substrate W to and from the plate 55A of the post-exposure bake treatment unit PEB via the substrate inlet 60C. Here, the adjacent treating units AD1 and AD2 and an adjacent treating unit AD3 to be mentioned later are also the exposure-related treating unit.

(1-3) Configuration of Carrier Buffer Device 8

Reference is made to FIGS. 1 and 2. The developing-treatment layer 5C is provided in the same stage as the carrier buffer device 8 and the buffer unit BU3 (i.e., third floor). That is, the second treating block 5 is lower than the first treating block 3. The carrier buffer devices 8 (carrier transport mechanism 61 and carrier storage shelf 63) are mounted on the second treating block 5. This can suppress a height of the substrate treating apparatus 1.

The carrier buffer device 8 includes a carrier transport mechanism 61 and a carrier storage shelf 63. The carrier transport mechanism 61 transports a carrier C between the platform 16 of each of the four openers 11 to 14 and the carrier storage shelf 63. The carrier storage shelf 63 stores the carrier C.

Reference is made to FIG. 2. The carrier transport mechanism 61 includes two articulated arms 65 and 66. The first articulated arm 65 includes a first end with a gripper 67, and a second articulated arm 66 includes a first end with a gripper 68. The first articulated arm 65 includes a second end supported on a strut lifting/lowering driving unit 69 so as to be movable in the up-down direction (Z-direction). The second articulated arm 66 includes a second end supported on the lifting/lowering driving unit 69 so as to be movable in the up-down direction.

Each of the two grippers 67 and 68 is configured to grasp a projection provided on a top face of the carrier C, for example. The lifting/lowering driving unit 69 is configured to make the two articulated arms 65 and 66 to be movable vertically individually. The two grippers 67 and 68, the two articulated arms 65 and 66, and the lifting/lowering driving unit 69 each include an electric motor.

A forward/backward driving unit 70 includes a supporting portion 70A configured to support the lifting/lowering driving unit 69, a longitudinal portion 70B extending longitudinally in the forward/rearward direction (X-direction), and an electric motor. For instance, the longitudinal portion 70B may be a rail (guide rail), and the supporting portion 70A may be a carriage. In this case, the electric motor may cause the carriage (supporting portion 70A) to move along the rail (longitudinal portion 70B).

Moreover, an electric motor, a plurality of pulleys, a belt, and a guide rail may be accommodated in the longitudinal portion 70B, and the supporting portion 70A may be fixed to the belt, for example. In this case, the electric motor may cause the pulleys to rotate to move the belt on the pulleys, whereby supporting portion 70A is moved along the guide rail. Moreover, an electric motor, a screw shaft, and a guide rail may be accommodated in the longitudinal portion 70B, and a nut configured to engage with the screw shaft may be provided in the supporting portion 70A, for example. In this case, the electric motor may cause the screw shaft to rotate to move the supporting portion 70A along the guide rail.

A rail 77 for an external transport mechanism OHT (Overhead Hoist Transport) is provided partially above the carrier storage shelf 63. The external transport mechanism OHT transports a carrier C in the factory. The external transport mechanism OHT transports the carrier C containing untreated substrates W to the carrier storage shelf 63. Moreover, the external transport mechanism OHT receives the carrier C containing treated substrates W from the carrier storage shelf 63. Untreated substrates W refer to substrates W not subjected to the substrate treatment by the substrate treating apparatus 1 in this embodiment, whereas treated substrates W refer to substrates W subjected to the substrate treatment by the substrate treating apparatus 1 in this embodiment. The carrier transport mechanism 61 is capable of freely moving the carrier C between the platforms 16 and the shelves 63.

(2) Operation of Substrate Treating Apparatus 1

Figure 9:
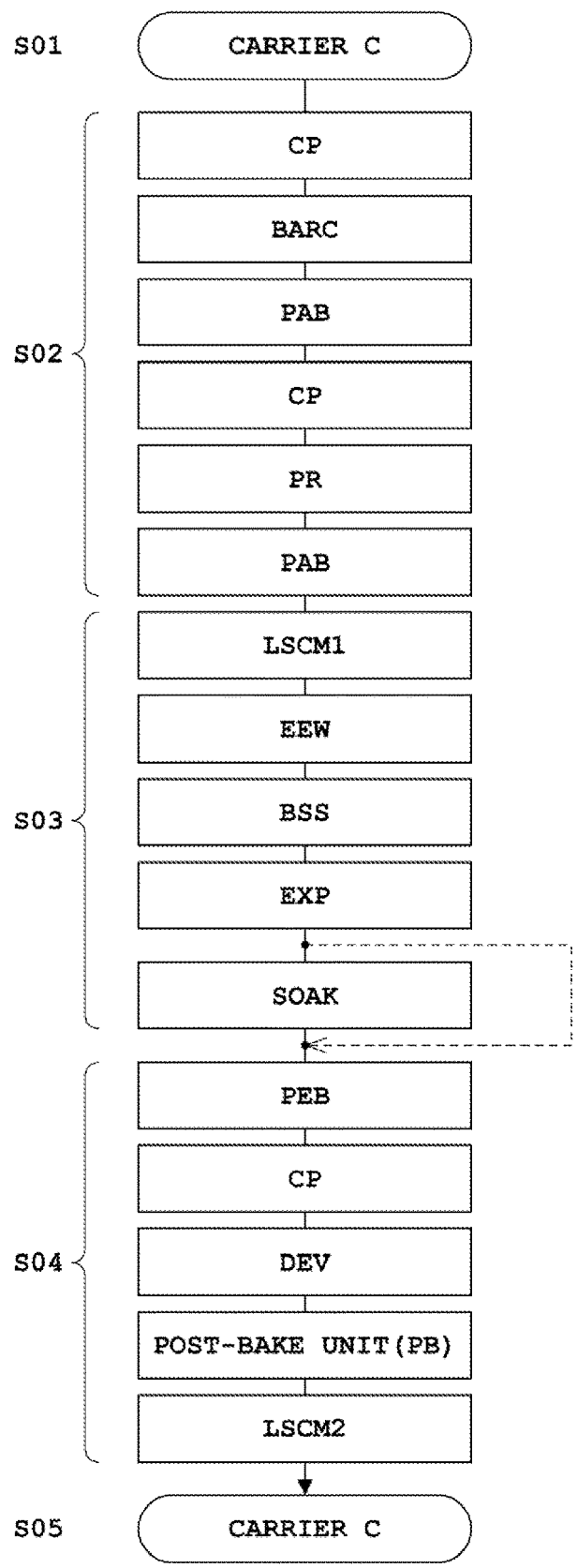
FIG. 9 is a flowchart illustrating an exemplary treatment process of the substrate treating apparatus according to the first embodiment.

The following describes operation of the substrate treating apparatus 1. FIG. 9 is a flowchart illustrating an exemplary treatment process of the substrate treating apparatus 1.

The carrier transport mechanism 61 shown in FIG. 2 transports the carrier C, containing the untreated substrates W transported by the external transport mechanism OHT, to one of the openers 11 and 12. In this explanation, it is assumed that the carrier C is transported to the opener 11. The shutter member and the shutter member driving mechanism (both not shown) open the opening 18 while detaching the lid of the carrier C placed on the platform 16 of the opener 11.

[Step S01] Transportation of Substrate W from Carrier C

The substrate transport mechanism MHU1 of the ID block 2 takes the substrate W from the carrier C placed on the platform 16 of the opener 11, and transports the taken substrate W to either of the two buffer units BU1 and BU2.

When all the substrates W are taken from the carrier C, the carrier transport mechanism 61 transports the empty carrier C to either of the two openers 13 and 14. If the empty carrier C is incapable of being transported to either of the two openers 13 and 14, the carrier transport mechanism 61 transports the empty carrier C to the carrier storage shelf 63. Moreover, the carrier transport mechanism 61 transports the carrier C where the untreated substrates W are accommodated, instead of the empty carrier C, to the opener 11.

Moreover, after taking all the substrates W from the carrier C placed on the platform 16 of the opener 11, the substrate transport mechanism MHU1 takes the substrate W from the carrier C placed on the platform 16 of the opener 12. After taking all the substrates W from the carrier C of the opener 12, the substrate transport mechanism MHU1 again starts taking the substrate W from a carrier C newly placed on the opener 11. That is, the substrate transport mechanism MHU1 takes the substrates W alternately from the carriers C of the two openers 11 and 12.

[Step S02] Forming Antireflection Film by Coating-Treatment Layer 5A (5B)

The coating-treatment layer 5A forms an antireflection film and a photoresist film on a substrate W, for example. Detailed description is as under. The substrate transport mechanism MHU4 of the coating-treatment layer 5A takes a substrate W from the buffer unit BU1, and transports the taken substrate W to the cooling unit CP, the coating unit BARC, and the heat treating unit PAB in this order. The coating unit BARC forms an antireflection film on the substrate W.

Thereafter, the substrate transport mechanism MHU4 of the coating-treatment layer 5A transports the substrate W on which the antireflection film is formed to the cooling unit CP, the coating unit PR, the heat treating unit PAB, and the buffer unit BU1 in this order. The coating unit PR forms the photoresist film on the substrate W (i.e., on the antireflection film).

Note that the same treatment is performed in the coating-treatment layer 5B as in the coating-treatment layer 5A. When the coating treatment is performed in the coating-treatment layer 5B, the substrate transport mechanism MHU4 of the coating-treatment layer 5B transports the substrate W, subjected to the coating treatment, to the buffer unit BU2. In this case, either of the two substrate transport mechanisms MHU1 and MHU2 of the ID block 2 transports the substrate W from the buffer unit BU2 to the buffer unit BU1.

[Step S03] Treatment in Interface Layer 3A

In the IF layer 3A, the substrate W, subjected to the coating treatment in the coating-treatment layer 5A (5B), is unloaded into the exposure device EXP. Moreover, the substrate W, subjected to the exposure treatment by the exposure device EXP, is loaded into the IF layer 3A. Detailed description is as under.

The substrate transport mechanism MHU3 (see FIG. 5) in the treating area 57 of the IF layer 3A takes a substrate W from the buffer unit BU1, and transports the substrate W to the inspection unit LSCM1, the edge exposing unit EEW, the rear face cleaning unit BSS, the mounting-cum-cooling unit P-CP (buffer unit BU4) in this order. The inspection unit LSCM1 inspects and measures a photoresist film (coated film). The substrate transport mechanism MHU5 in the interface area 58 takes the substrate W from the mounting-cum-cooling unit P-CP, and unloads the substrate W to the exposure device EXP. The exposure device EXP performs the exposure treatment on the unloaded substrate W.

The substrate transport mechanism MHU5 loads the substrate W, treated by the exposure device EXP, into the interface area 58, and transports the substrate W to the substrate platform PS1 (buffer unit BU4, see FIG. 1). The substrate transport mechanism MHU3 in the treating area 57 receives the substrate W from the substrate platform PS1, and transports the substrate W to the post-exposure cleaning unit SOAK and the buffer unit BU1 in this order.

Note that, when the exposure device EXP performs an exposure treatment without using immersion exposure technology, there is no need to perform any cleaning treatment by the post-exposure cleaning unit SOAK as shown in FIG. 9 by dotted lines. In this case, the substrate transport mechanism MHU3 in the treating area 57 receives the substrate W from the substrate platform PS1, and transports the substrate W directly to the buffer unit BU1.

The substrate transport mechanism MHU1 of the ID block 2 receives the substrate W from the buffer unit BU1. Then, the substrate transport mechanism MHU1 transports the substrate W directly to one of the four post-exposure bake treatment units PEB in the developing-treatment layer 3B, for example, as shown in FIGS. 7 and 8A. The four post-exposure bake treatment units PEB correspond to the adjacent treating unit AD1. Accordingly, the substrate transport mechanism MHU1 transports the substrate W directly to the plate 55A of the predetermined post-exposure bake treatment unit PEB through the substrate inlet 60B without transporting the substrate W to the buffer unit BU2, as shown in FIG. 8A. This achieves omission of operation that the substrate transport mechanism MHU3 of the developing-treatment layer 3B takes the substrate W from the buffer unit BU2 and transports the taken substrate W to the plates 55A of the post-exposure bake treatment unit PEB through the substrate inlet 60A. Accordingly, the load in substrate transportation on the substrate transport mechanism MHU3 of the developing-treatment layer 5B can be reduced.

The same is performed in the case where the substrate W is transported to one of the four post-exposure bake treatment units PEB as the adjacent treating unit AD1 of the developing-treatment layer 3C. Moreover, the substrate W, subjected to the exposure treatment, is transported to the two developing-treatment layers 3B and 3C alternately from the IF layer 3A.

[Step S04] Developing Treatment by Developing-Treatment Layer 3B (3C)

The developing-treatment layers 3B and 3C each perform a developing treatment on the substrate W. Detailed description is as under. The substrate W transported directly by the substrate transport mechanism MHU1 is heated by the post-exposure bake treatment unit PEB. The substrate transport mechanism MHU3 of the developing-treatment layer 3B receives the substrate W from the post-exposure bake treatment unit PEB, and transports the substrate W to the cooling unit CP, the developing unit DEV, the post-bake unit PB, the inspection unit LSCM2, and the buffer unit BU2 in this order. The developing unit DEV performs the developing treatment on the substrate W subjected to the exposure treatment by the exposure device EXP. The inspection unit LSCM2 inspects the substrate W subjected to the developing treatment.

Moreover, the same treatment is performed in the developing-treatment layer 3C in the developing-treatment layer 3B. The developed substrate W is finally transported to the buffer unit BU3 by the developing-treatment layer 3C.

[Step S05] Substrate Transportation to Carrier C

The substrate transport mechanism MHU2 of the ID block 2 takes the substrate W from one of the two buffer units BU2 and BU3, and transports the taken substrate W to the carrier C placed on the platform 16 of one of the two openers 13 and 14 (e.g., opener 13). The substrate transport mechanism MHU2 alternately takes the substrate W from the two buffer units BU2 and BU3, and transports the taken substrate W to the carrier C placed on the platform 16. When all substrates W are returned to the carrier C, the shutter member and the shutter driving mechanism close the opening 18 while attaching the lid to the carrier C. Thereafter, for delivery to the external transport mechanism OHT, the carrier transport mechanism 61 transports the carrier C, containing the treated substrate W, from the opener 13.

According to the present embodiment, the first treating block 3 includes the developing-treatment layers 3B and 3C and the IF layer 3A located in the upward/downward direction. Accordingly, the IF layer 3A can be connected to the ID block 2. Moreover, the substrate transport mechanisms MHU1 and MHU2 of the ID block 2 each transport the substrate W from one of the buffer units (e.g., BU2) located at a predetermined height position in the substrate buffer BF to another of the buffer units (e.g., BU1) located at a different height position in the substrate buffer BF. Accordingly, the IF layer 3A may access to the buffer unit BU1 located at a height position corresponding to the IF layer 3A. Thus, the IF layer 3A can be made compact. Moreover, the IF layer 3A is located in the up-down direction relative to the developing-treatment layers 3B and 3C, leading to reduction in footprint of the substrate treating apparatus 1.

Moreover, the IF layer 3A includes the treating area 57 coupled with the ID block 2, the buffer unit BU4 configured to place the substrates W therein, and the interface area 58 coupled with the treating area 57 via the buffer unit BU4. The treating area 57 includes the exposure-related treating unit (e.g., rear face cleaning units BSS, post-exposure cleaning unit SOAK, edge exposing unit EEW, inspection unit LSCM1, and post-exposure bake treatment unit PEB) and the substrate transport mechanism MHU3. Here, the substrate transport mechanism MHU3 transports the substrate W among the substrate buffer BF in the ID block 2, the post-exposure bake treatment unit PEB, and the buffer unit BU4. The interface area 58 does not include the exposure-related treating unit (e.g., post-exposure bake treatment unit PEB) but includes the substrate transport mechanism MHU5

(transport mechanism for an exposure device) configured to transport the substrate W between the exposure device EXP and the buffer unit BU4.

Since the exposure-related treating unit is provided in the IF layer 3A, the number of the exposure-related treating units provided in other processing layers is suppressible. As a result, the other treatment layers can include a treating unit rather than the exposure-related treating unit.

SECOND EMBODIMENT

Figure 10:
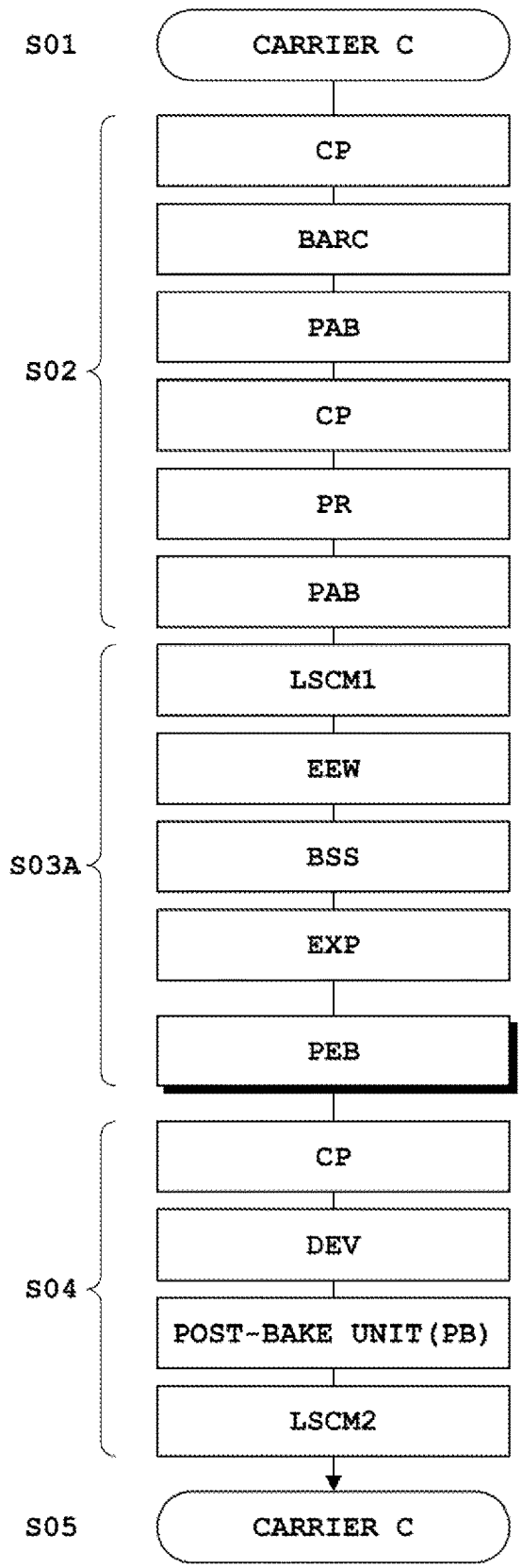
FIG. 10 is a flowchart illustrating an exemplary treatment process of the substrate treating apparatus according to a second embodiment.

A second embodiment of the present invention will now be described with reference to the drawings. Here, the description common to that of the first embodiment is to be omitted. FIG. 10 is a flowchart illustrating an exemplary treatment process of the substrate treating apparatus 1 according to a second embodiment.

In the first embodiment, the post-exposure cleaning unit SOAK cleans the substrate W subjected to the exposure treatment. In this regard, when the exposure device EXP performs an exposure treatment without using immersion exposure technology, there is no need to perform any cleaning treatment by the post-exposure cleaning unit SOAK. The second embodiment describes operation of the substrate treating apparatus 1 in this case. Especially, the following describes features different from the first embodiment.

[Step S03A] Treatment in IF Layer 3A

In the IF layer 3A, the substrate W, subjected to the coating treatment in the coating-treatment layer 5A (5B), is unloaded into the exposure device EXP. The exposure device EXP performs the exposure treatment on the unloaded substrate W. The same operation as that in the first embodiment is performed up to here, and accordingly, the description thereof is to be omitted. Thereafter, the substrate W, subjected to the exposure treatment by the exposure device EXP, is loaded into the IF layer 3A. Detailed description is as under.

The substrate transport mechanism MHU5 loads the substrate W, treated by the exposure device EXP, into the interface area 58, and transports the substrate W not to the substrate platform PS1 (buffer unit BU4) but to any one of the four post-exposure bake treatment units PEB (see FIG. 7). The four post-exposure bake treatment units PEB correspond to an adjacent treating unit AD2 located adjacent to the interface area 58. In this case, the four post-exposure bake treatment units PEB are each provided with two substrate inlets 60A and 60C for taking the substrate W in and out from two directions, as shown in FIG. 8B. Accordingly, the substrate transport mechanism MHU5 in the interface area 58 causes the hand 21 to move into the substrate inlet 60C without through the substrate platform PS1 (buffer unit BU4), and transports the substrate W directly to the predetermined post-exposure bake treatment unit PEB.

This achieves omission of operation that the substrate transport mechanism MHU3 in the treating area 57 of the IF layer 3A takes the substrate W from the substrate platform PS1 (buffer unit BU4), and transports the taken substrate W to the plate 55A of the post-exposure bake treatment unit PEB through the substrate inlet 60A. Accordingly, the load in substrate transportation on the substrate transport mechanism MHU3 in the treating area 57 can be reduced. Moreover, since time from completion of the exposure treatment to start of the post-exposure bake treatment is shortened, leading to stable dimensional uniformity of the resist pattern after the development treatment.

Thereafter, the substrate transport mechanism MHU3 in the treating area 57 of the IF layer 3A receives the substrate W from the post-exposure bake treatment unit PEB via the substrate inlet 60A. Then, the substrate transport mechanism MHU3 transports the substrate W to the buffer unit BU1. Then, either of the two substrate transport mechanisms MHU1 and MHU2 receives the substrate W from the buffer unit BU1, and transports the substrate W to either the buffer unit BU2 or BU3.

According to the present embodiment, the treating area 57 includes four post-exposure bake treatment units PEB (adjacent treating unit AD2) that are located adjacent to the interface area 58. A fifth substrate transport mechanism MHU5 in the interface area 58 directly transports the substrate W, subjected to the exposure treatment, to the post-exposure bake treatment unit PEB (adjacent treating unit AD2) in the treating area 57. When a substrate W is transported in the IF layer 3A from the interface area 58 to the treating area 57 via the buffer unit BU4, for example, the substrate transport mechanism MHU3 of the treating area 57 has to transport the substrate W from the buffer unit BU4 to any of the four post-exposure bake treatment units PEB (adjacent treating unit). With the present embodiment, the substrate transport mechanism MHU5 can transport the substrate W, subjected to the exposure treatment, to the post-exposure bake treatment unit PEB without through the buffer unit BU4. Accordingly, the load in substrate transportation on the substrate transport mechanism MHU3 in the treating area 57 can be reduced. Moreover, since time from completion of the exposure treatment to start of the post-exposure bake treatment is shortened, leading to stable dimensional uniformity of the resist pattern after the development treatment.

THIRD EMBODIMENT

A third embodiment of the present invention will now be described with reference to the drawings. Here, the description common to that of Embodiments 1 and 2 is to be omitted.

As shown in FIG. 1, in the first embodiment, the IF layer 3A is located such that the end portions thereof adjacent to the exposure device EXP protrude outward of the developing-treatment layers 3B and 3C. In this regard, in the third embodiment, the IF layer 3A may be located such that the end portion thereof adjacent to the exposure device EXP is accommodated within the developing-treatment layers 3B and 3C.

Figure 11:
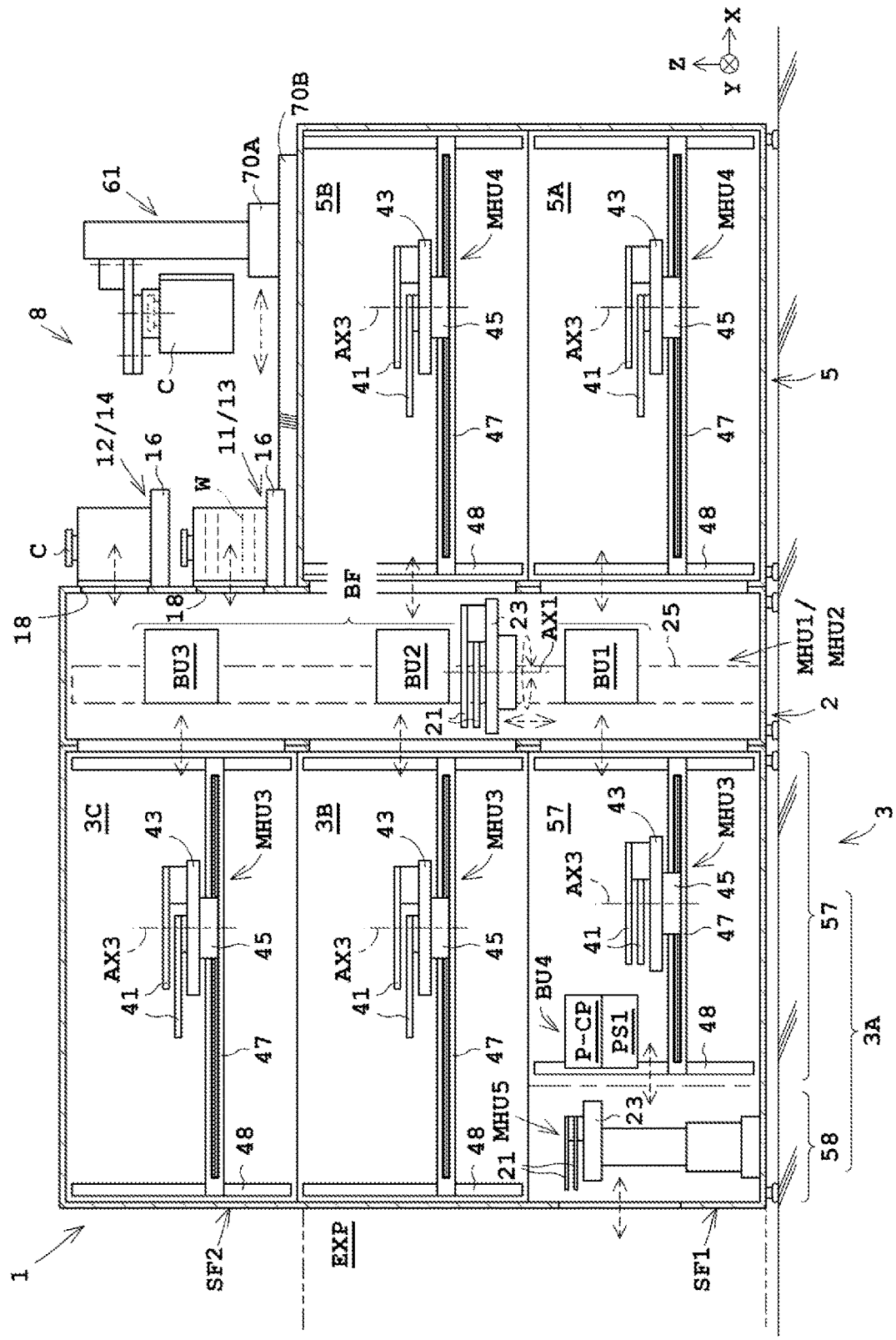
FIG. 11 is a longitudinal cross-sectional view of a substrate treating apparatus according to a third embodiment.

FIG. 11 is a longitudinal cross-sectional view of a substrate treating apparatus 1 according to the third embodiment. In FIG. 11, the end portion of the interface area 58 adjacent to the exposure device EXP conforms to the end portions of the developing-treatment layers 3B and 3C adjacent to the exposure device EXP. That is, a side face SF1 of the interface area 58 adjacent to the exposure device EXP is flush with a side face SF2 of the developing-treatment layers 3B and 3C adjacent to the exposure device EXP.

Figure 12A:
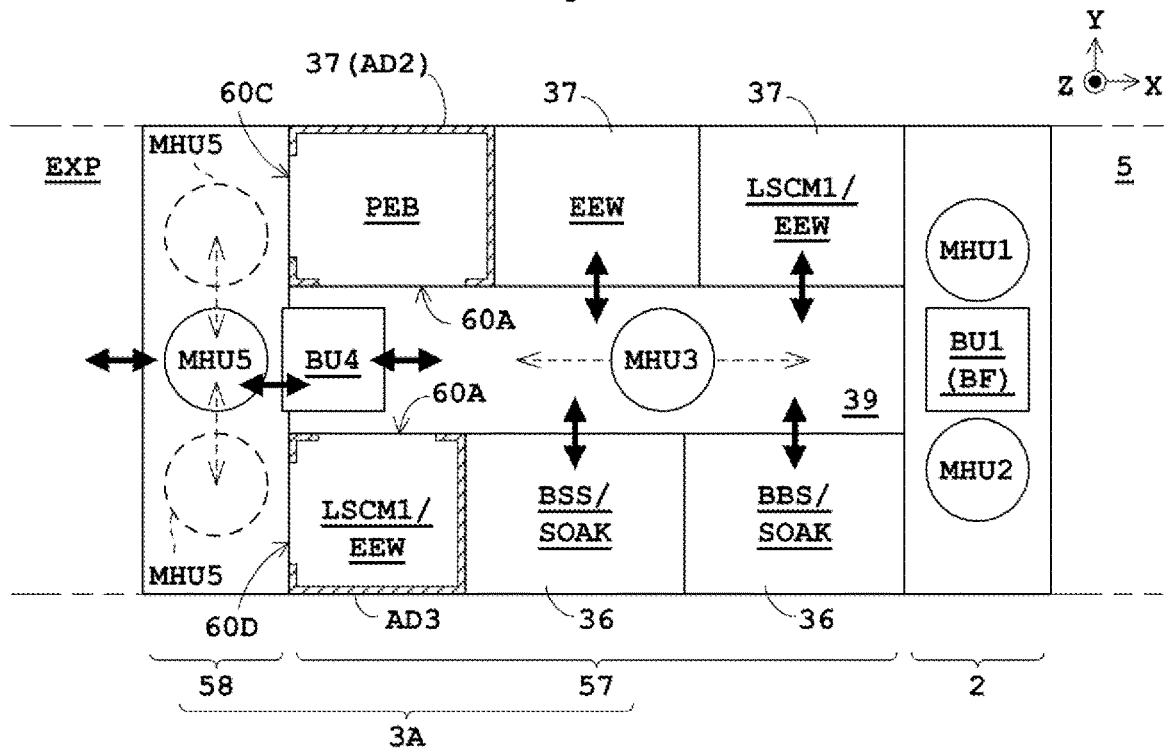
FIGS. 12A and 12B are each a horizontal cross-sectional view of a configuration and operation of an interface layer according to the third embodiment.

Moreover, FIG. 12A is a horizontal cross-sectional view of a configuration and operation of the IF layer 3A according to the third embodiment. Since the interface area 58 is accommodated within the developing-treatment layers 3B and 3C, the treating area 57 has a reduced installation area. Accordingly, the rear face cleaning units BSS and the post-exposure cleaning units SOAK are arranged in a space of two levels×two lines. Moreover, the post-exposure bake treatment units PEB, the edge exposing units EEW, and the inspection units LSCM1 are arranged in a space of three levels×four lines.

The substrate treating apparatus 1 operates in such a manner as shown in steps S03 and S03A in the first and second embodiments. For example, as shown in step S03 of FIG. 9, the substrate transport mechanism MHU3 in the treating area 57 of the IF layer 3A takes a substrate W from the buffer unit BU1, and transports the substrate W to the inspection unit LSCM1, the edge exposing unit EEW, the rear face cleaning unit BSS, the mounting-cum-cooling unit P-CP (buffer unit BU4) in this order. Thereafter, the substrate transport mechanism MHU5 in the interface area 58 takes the substrate W from the mounting-cum-cooling unit P-CP, and unloads the substrate W to the exposure device EXP.

Thereafter, the substrate transport mechanism MHU5 loads the substrate W, treated by the exposure device EXP, into the interface area 58, and transports the substrate W to the substrate platform PS1 (buffer unit BU4). The substrate transport mechanism MHU3 in the treating area 57 takes the substrate W from the substrate platform PS1, and transports the substrate W to the post-exposure cleaning unit SOAK and the buffer unit BU1 in this order.

With the present embodiment, the interface area 58 is located such that an end portion thereof adjacent to the exposure device EXP is accommodated within the two developing-treatment layers 3B and 3C. This achieves reduction in footprint of the substrate treating apparatus 1.

Figure 12B:
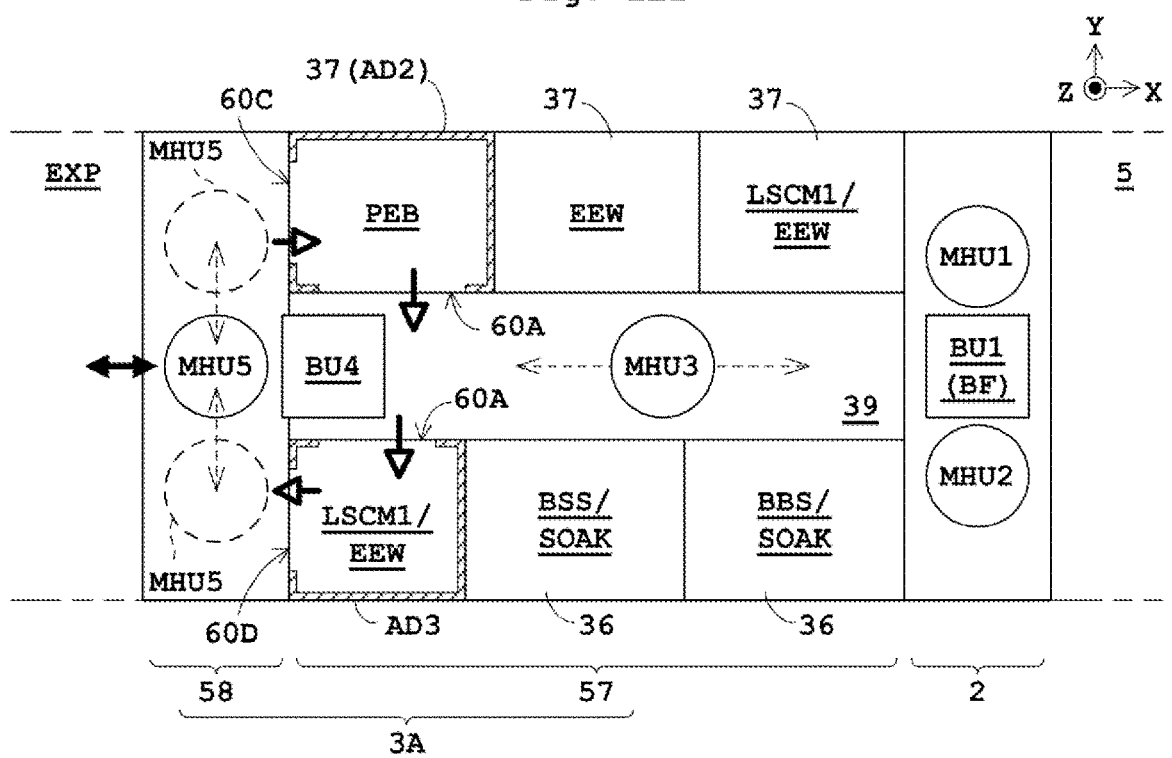

Here, as shown in FIG. 12B, the treating area 57 includes the edge exposing unit EEW and the inspection unit LSCM1 located in the up-down direction. The edge exposing unit EEW and the inspection unit LSCM1 are located adjacent to the interface area 58. The edge exposing unit EEW corresponds to an adjacent treating unit AD3. The edge exposing unit EEW (adjacent treating unit AD3) and the post-exposure bake treatment unit PEB (adjacent treating unit AD2) are located across the transportation space 39. The edge exposing unit EEW as the adjacent treating unit AD3 includes two substrate inlets 60A and 60D for taking the substrate W in and out in two directions, which is similar to the adjacent treating units AD1 and AD2. The substrate inlet 60D is opened toward the interface area 58.

For example, the substrate treating apparatus 1 operates as under when any treatment by the rear face cleaning unit BSS or the post-exposure cleaning unit SOAK is not needed. In FIG. 12B, the substrate transport mechanism MHU3 in the treating area 57 of the IF layer 3A takes a substrate W from the buffer unit BU1, and transports the substrate W to the inspection unit LSCM1 and the edge exposing unit EEW in this order. At this time, the substrate transport mechanism MHU3 in the treating area 57 transports the substrate W to the edge exposing unit EEW via the substrate inlet 60A. After the treatment by the edge exposing unit EEW, the substrate transport mechanism MHU5 in the interface area 58 receives the substrate W from the edge exposing unit EEW via the substrate inlet 60D, and unloads the substrate W to the exposure device EXP. Thus, the substrate transport mechanism MHU3 of the treating area 57 can omit the step of taking the substrate W from the edge exposing unit EEW and transporting the substrate W to the buffer unit BU4. Accordingly, the load in substrate transportation on the substrate transport mechanism MHU3 in the treating area 57 can be reduced.

Thereafter, the substrate transport mechanism MHU5 loads the substrate W, subjected to the exposure treatment by the exposure device EXP, into the interface area 58, and directly transports the substrate W not to the substrate platform PS1 (buffer unit BU4) but to any one of the four post-exposure bake treatment units PEB. Such transportation is performed through the substrate inlet 60C. Here, the four post-exposure bake treatment units PEB correspond to the adjacent treating unit AD2 (see FIG. 7). After the treatment by the post-exposure bake treatment unit PEB, the substrate transport mechanism MHU3 in the treating area 57 receives the substrate W from the post-exposure bake treatment unit PEB via the substrate inlet 60A, and transports the substrate W to the buffer unit BU1. Thus, the substrate transport mechanism MHU3 of the treating area 57 can omit the step of taking the substrate W from the buffer unit BU4 and transporting the substrate W to the post-exposure bake treatment unit PEB. Accordingly, the load in substrate transportation on the substrate transport mechanism MHU3 in the treating area 57 can be reduced.

Moreover, as shown in FIG. 12B, the treating area 57 includes the inspection unit LSCM1 that is located adjacent to the interface area 58 and above or below the edge exposing unit EEW. The inspection unit LSCM1 may also correspond to the adjacent treating unit AD3. In this case, the substrate transport mechanism MHU3 in the treating area 57 may transport the substrate W to the inspection unit LSCM1 via the substrate inlet 60A, and the substrate transport mechanism MHU5 in the interface area 58 may receive the substrate W from the inspection unit LSCM1 via the substrate inlet 60D. Moreover, the rear face cleaning unit BSS and the post-exposure cleaning unit SOAK may not be provided when any treatment by the rear face cleaning unit BSS or the post-exposure cleaning unit SOAK is not needed. Moreover, the buffer unit BU4 may not be provided when the buffer unit BU4 is not needed.

FOURTH EMBODIMENT

A fourth embodiment of the present invention will now be described with reference to the drawings. Here, the description common to that of the first to third embodiments is to be omitted.

In the IF layer 3A in the first embodiment, the substrate W is transported from the buffer unit BU1 to the exposure device EXP, and after the exposure treatment is performed, the substrate W is returned from the exposure device EXP to the buffer unit BU1. In this regard, after the exposure treatment, the substrate W may be transported to the two developing-treatment layers 3B and 3C without returning to the buffer unit BU1 and without using the two substrate transport mechanisms MHU1 and MHU2 of the ID block 2.

Figure 13:
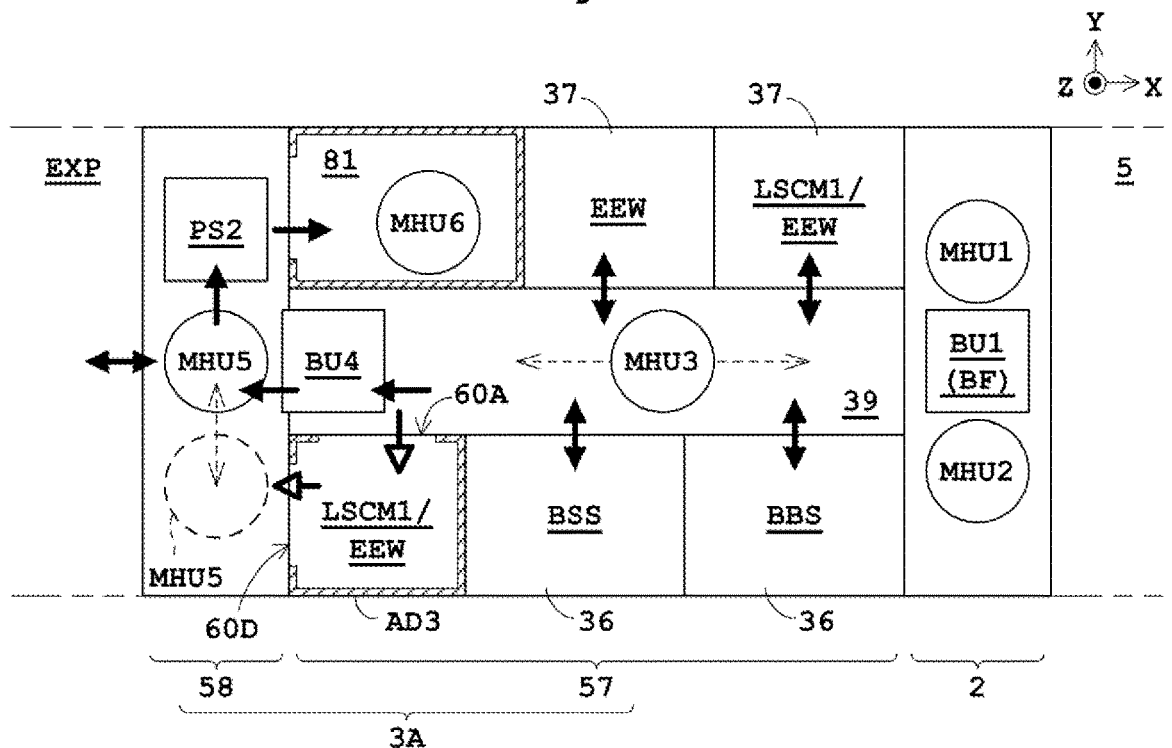
FIG. 13 is a horizontal cross-sectional view of an interface layer according to a fourth embodiment.

FIG. 13 is a horizontal cross-sectional view of an IF layer 3A according to the fourth embodiment. The IF layer 3A includes a transportation space 81, a sixth substrate transport mechanism MHU6, and a substrate platform PS2. The transportation space 81 is located in an area where the heat treating unit 37 in the treating area 57 is provided. The area is located adjacent to the interface area 58. The substrate transport mechanism MHU6 is located in the transportation space 81. The substrate transport mechanism MHU6 is configured in the same manner as the substrate transport mechanisms MHU1 and MHU2. The substrate platform PS2 is located in the interface area 58 or between the interface area 58 and the transportation space 81 such that the two substrate transport mechanisms MHU5 and MHU6 can deliver the substrates W. The substrate platform PS2 places one or more substrates W thereon.

The rear face cleaning units BSS are arranged in a space of two levels×two lines. Moreover, the edge exposing units EEW and the inspection units LSCM1 are arranged in a space of four levels×two lines. The sixth substrate transport mechanism MHU6 corresponds to the interlayer transport mechanism in the present invention.

Figure 14:
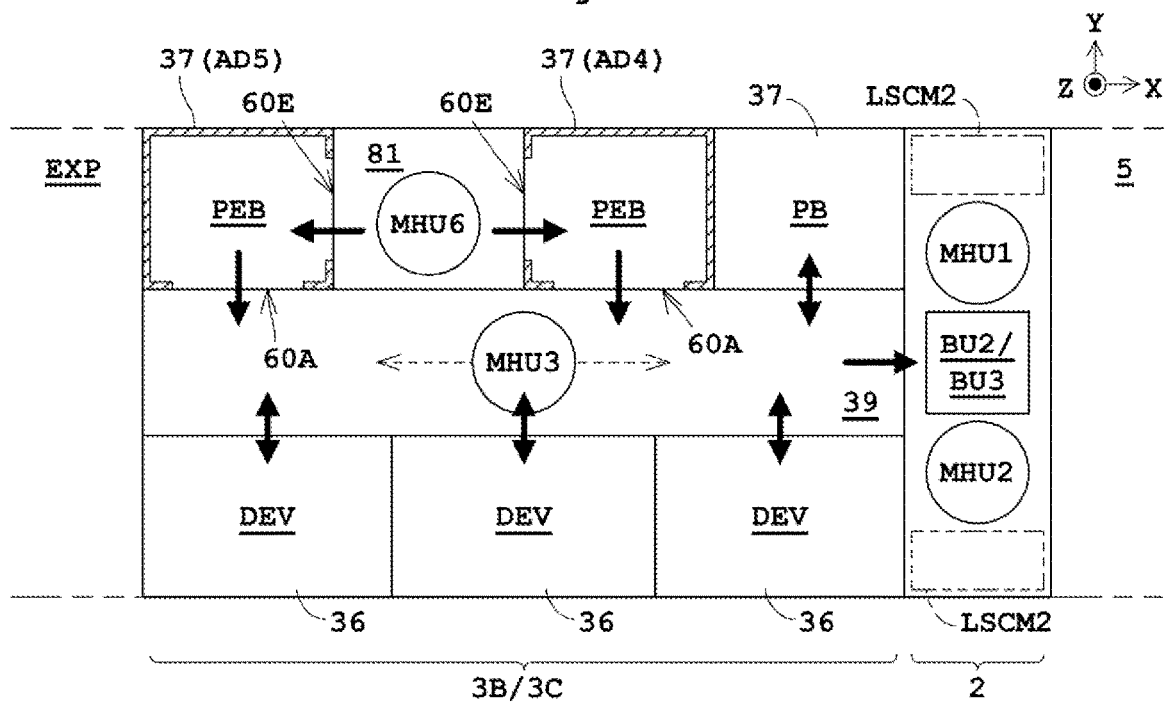
FIG. 14 is a horizontal cross-sectional view of a developing-treatment layer in upper and intermediate layers according to the fourth embodiment.

FIG. 14 is a horizontal cross-sectional view of two developing-treatment layers 3B and 3C according to the fourth embodiment. The two developing-treatment layers 3B and 3C each include the transportation space 81. The transportation space 81 is located in an area where the heat treating unit 37 and other treating units 37 are arranged. In FIG. 14, the transportation space 81 is surrounded by a plurality of post-exposure bake treatment units PEB. The post-exposure bake treatment units PEB are each provided with two substrate inlets 60A and 60E for entering from two directions. The substrate transport mechanism MHU6 loads the substrate W, taken from the substrate platform PS2, to the post-exposure bake treatment unit PEB of the developing-treatment layers 3B and 3C via the substrate inlet 60E. The substrate transport mechanism MHU3 in the developing-treatment layers 3B and 3C delivers the substrate W to and from the plate 55 of the post-exposure bake treatment unit PEB via the substrate inlet 60A. Note that the developing units DEV are arranged in a space of two levels×three lines.

Figure 15:
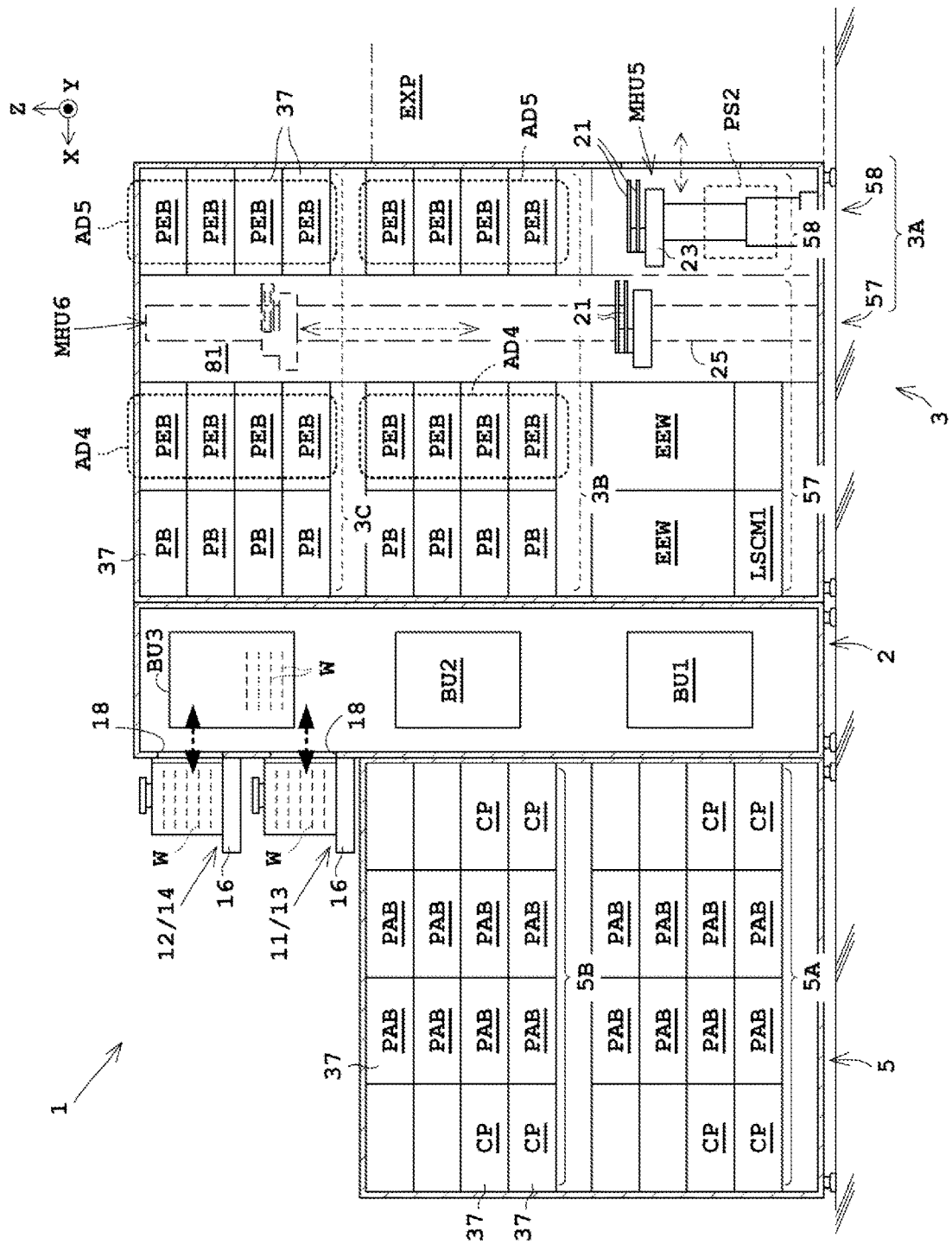
FIG. 15 is a left side view of the substrate treating apparatus according to the fourth embodiment.

Reference is made to FIG. 15. FIG. 15 is a left side view of the substrate treating apparatus 1 according to the fourth embodiment. The transportation space 81 is a space extending in the up-down direction from the treating area 57 in the IF layer 3A through the two developing-treatment layers 3B and 3C. The sixth substrate transport mechanism MHU6 can cause the two hands 21 to move from the IF layer 3A in the lower layer to the developing-treatment layer 3C in the upper layer.

The two developing-treatment layers 3B and 3C each include eight post-exposure bake treatment units PEB as adjacent treating units AD4 and AD5. As shown in FIG. 15, the eight post-exposure bake treatment units PEB are located adjacent to the transportation space 81, and the transportation space 81 is surrounded by the post-exposure bake treatment units PEB each in four levels. The sixth substrate transport mechanism MHU6 located in the transportation space 81 transports the substrates W to the post-exposure bake treatment units PEB individually through the substrate inlets 60E of the post-exposure bake treatment units PEB (see FIG. 14). Moreover, each of the two developing-treatment layers 3B and 3C includes four post-bake units PB.

Note that the number and types of the heat treating unit 37 and other treating units are variable as required. For example, part of the eight post-exposure bake treatment units PEB and part of the four post-bake units PB may be replaced by the cooling unit CP. Alternatively, the ID block 2 may include inspection units LSCM2, as shown in FIG. 14. In this case, the inspection units LSCM2 may be provided such that the inspection unit LSCM2 and the buffer units BU2 and BU3 (substrate buffer BF) are located across the substrate transport mechanism MHU1. Moreover, the inspection unit LSCM2 may be provided such that the inspection units LSCM2 and the buffer units BU2 and BU3 are located across the substrate transport mechanism MHU2. The inspection units LSCM2 are provided in each stage of the two developing-treatment layers 3B and 3C.

An operation of the substrate treating apparatus 1 will now be described with reference to FIG. 10. Either of the two coating-treatment layers 5A and 5B performs the coating treatment to the substrate W, and the substrate W is transported to the buffer unit BU1.

[Step S03A] Treatment in IF Layer 3A

In the IF layer 3A, the substrate W, subjected to the coating treatment in the coating-treatment layer 5A (5B), is unloaded into the exposure device EXP. The exposure device EXP performs the exposure treatment on the unloaded substrate W. The same operation as that in the first embodiment is performed up to here, and accordingly, the description thereof is to be omitted. Thereafter, the substrate W, subjected to the exposure treatment by the exposure device EXP, is loaded into the IF layer 3A. Detailed description is as under.

The substrate transport mechanism MHU5 loads the substrate W, treated by the exposure device EXP, into the interface area 58, and transports the substrate W to the substrate platform PS2. The substrate transport mechanism MHU6 takes the substrate W from the substrate platform PS2. Thereafter, the substrate transport mechanism MHU6 transports the substrate W to one of the eight post-exposure bake treatment units PEB in either of the two developing-treatment layers 3B and 3C, as shown in FIG. 15. Such transportation of the substrate W to the post-exposure bake treatment unit PEB is performed through the substrate inlet 60E (see FIG. 14).

[Steps S04, S05] Developing Treatment by Developing-Treatment Layer 3B (3C) and the Like For example, in the developing-treatment layer 3B, the substrate transport mechanism MHU3 receives the substrate W, subjected to the heat treatment, from the post-exposure bake treatment unit PEB via the substrate inlet 60A. Thereafter, the substrate transport mechanism MHU3 transports the substrate W to the developing unit DEV, the post-bake unit PB, and the buffer unit BU2 in this order. Note that, when the developing-treatment layer 3B includes the cooling unit CP, the substrate transport mechanism MHU3 transports the substrate W, subjected to the heat treatment in the post-exposure bake treatment unit PEB, to the cooling unit CP, the developing unit DEV, the post-bake unit PB, and the buffer unit BU2 in this order. Moreover, transportation to the post-bake unit PB is omittable. Then, either of the two substrate transport mechanisms MHU1 and MHU2 of the ID blocks 2 receives the substrate W from the buffer unit BU2, and transports the substrate W to the inspection unit LSCM2. Thereafter, when the inspection unit LSCM2 adjacent to the first substrate transport mechanism MHU1 inspects the substrate W, the substrate transport mechanism MHU1 transports the substrate W to either of the two buffer units BU2 and BU3. Then, the second substrate transport mechanism MHU2 receives the substrate W from one of the buffer units BU2 and BU3 and the inspection unit LSCM2 adjacent to the second substrate transport mechanism MHU2, and transports the substrate W to the carrier C on the platform 16 of either of the two openers 13 and 14.

According to the present embodiment, the interface area 58 includes the substrate platform PS2 configured to place the substrates W thereon. The first treating block 3 includes the transportation space 81 that extends in the up-down direction from the treating area 57 in the IF layer 3A through the two developing-treatment layers 3B and 3C, and the sixth substrate transport mechanism MHU6 located in the transportation space 81. The two developing-treatment layers 3B and 3C include the post-exposure bake treatment units PEB (adjacent treating units AD4 and AD5) that are located adjacent to the transportation space 81. The substrate transport mechanism MHU6 receives the substrate W from the substrate platform PS2 in the interface area 58, and transports the substrate W directly to the post-exposure bake treatment unit PEB of the two developing-treatment layers 3B and 3C.

There may need much time to transport a substrate W from the IF layer 3A to the ID block 2, and further from the ID block 2 to the two developing-treatment layers 3B and 3C. Moreover, a large load may possibly be applied to the transport mechanism of the IF layer 3A. With the present embodiment, the substrate W can be directly transported to the post-exposure bake treatment units PEB of the two developing-treatment layers 3B and 3C without through the ID block 2. Accordingly, the substrate W can be transported rapidly to the two developing-treatment layers 3B and 3C and also the load on the substrate transport mechanism MHU3 of the IF layer 3A can be reduced. Moreover, the transportation space 81 where the substrate transport mechanism MHU6 is located is provided in not only the IF layer 3A but also an area of the developing-treatment layers 3B and 3C. Thus, the IF layer 3A can be kept compact.

Figure 16A:
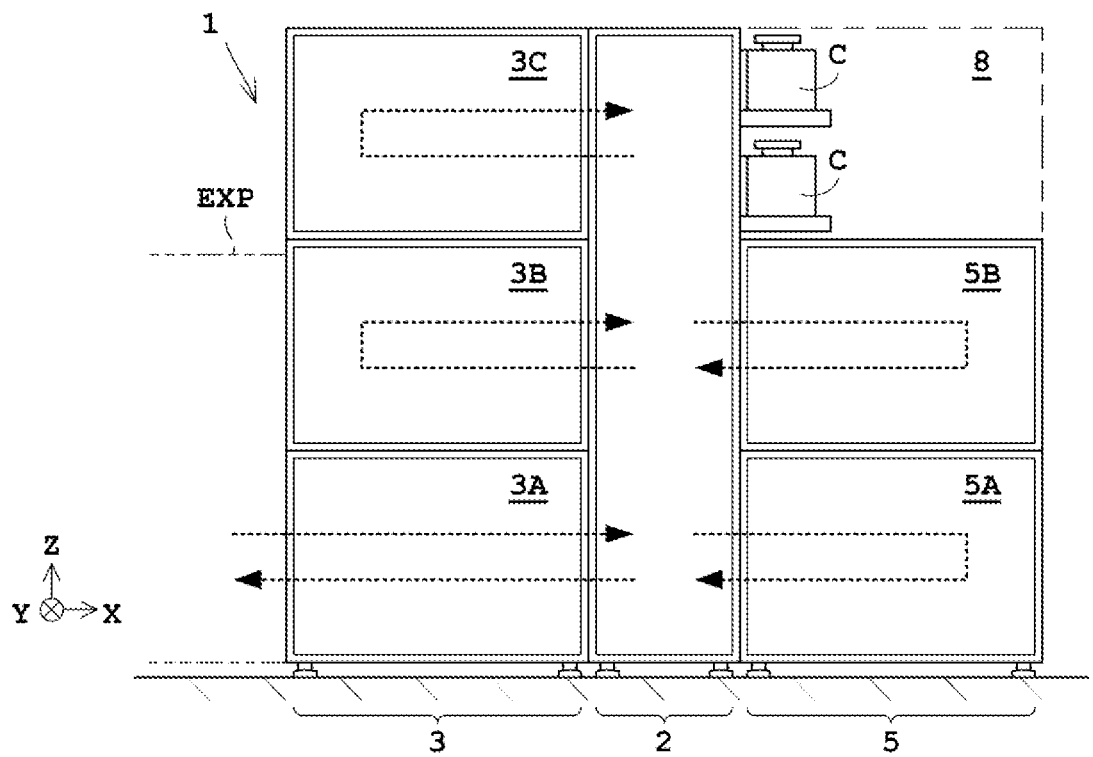
FIGS. 16A and 16B each illustrate an effect of the fourth embodiment.
Figure 16B:
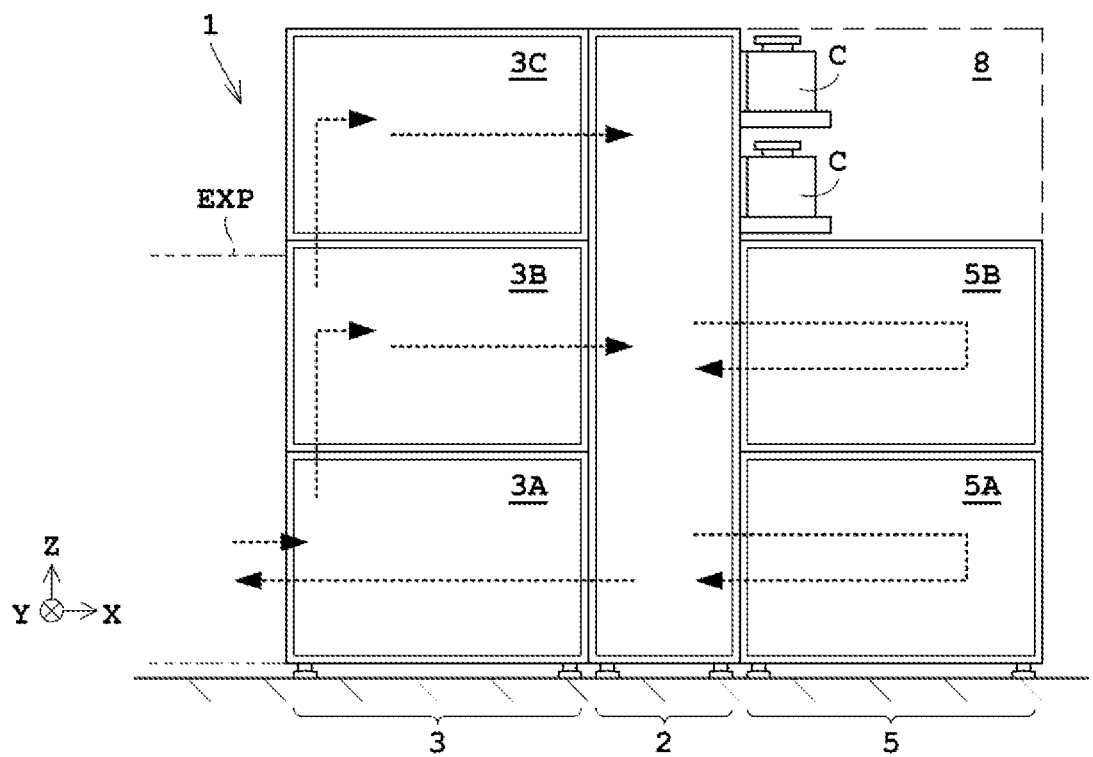

Supplementary explanation is made to an effect. As shown in FIG. 16A, when the substrate W reciprocates between the exposure device EXP and the ID block 2, a large load may be applied in substrate transportation by the substrate transport mechanism MHU3 in the IF layer 3A. In addition, a load is applied in substrate transportation by the two substrate transport mechanisms MHU1 and MHU2 in the ID block 2. As shown in FIG. 16B, the substrate transport mechanism MHU6 provided in the first treating block 3 achieves not only omission of substrate transportation in a return path from the exposure device EXP to the ID block 2 but also reduction in a load in substrate transportation by the ID block 2.

Figure 17:
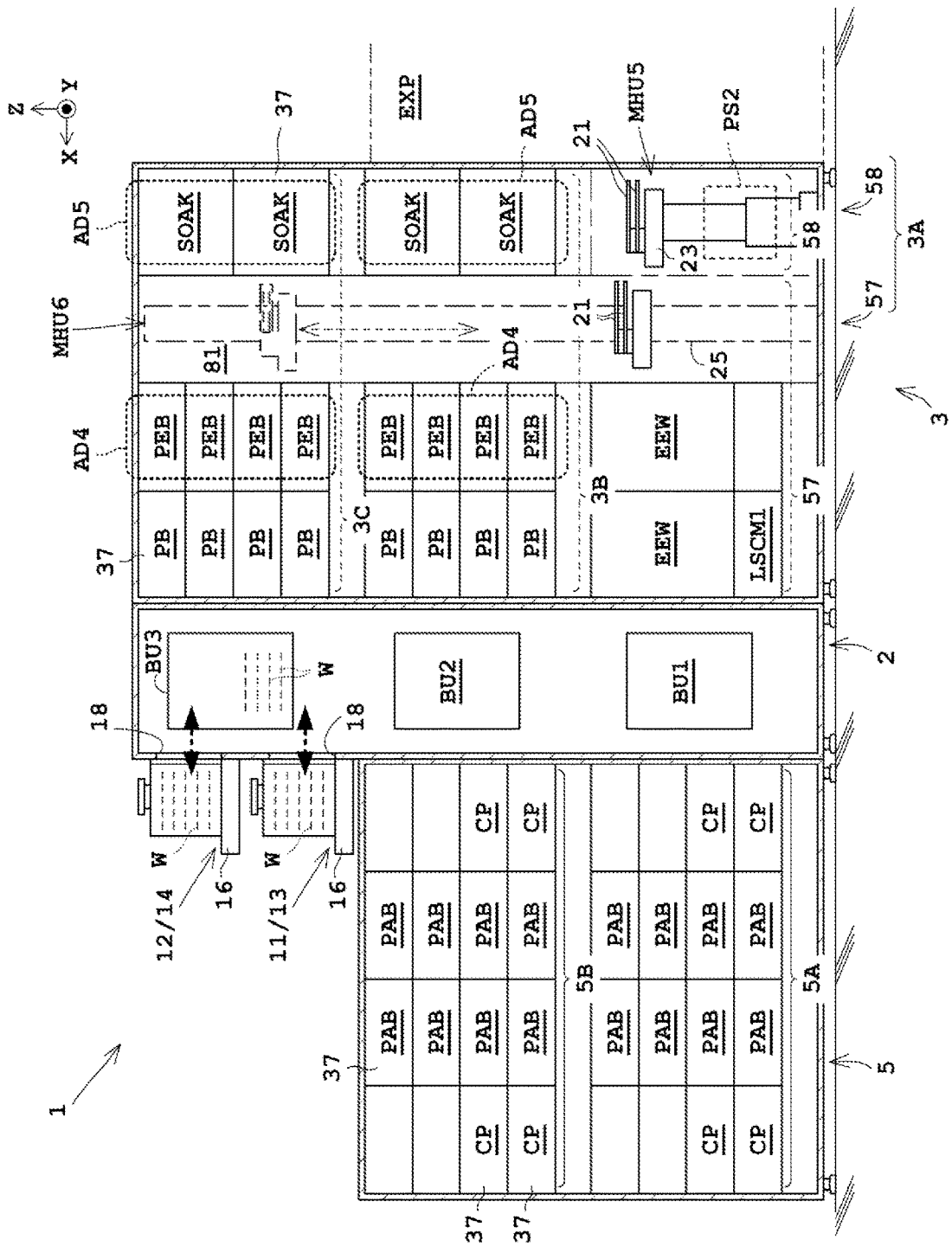
FIG. 17 is a left side view of a substrate treating apparatus according to one modification.

Moreover, the treating unit may be changed as shown in FIG. 17. Detailed description is as under. In FIG. 15, the two developing-treatment layers 3B and 3C each include four post-exposure bake treatment units PEB as an adjacent treating unit AD5. In this regard, in FIG. 17, the two developing-treatment layers 3B and 3C may each include two post-exposure cleaning units SOAK instead of the four post-exposure bake treatment units PEB. In this case, the following operation may be performed. The sixth substrate transport mechanism MHU6 takes the substrate W from the substrate platform PS2 in the interface area 58, and transports the substrate W directly to one of two post-exposure cleaning units SOAK of either of the two developing-treatment layers 3B and 3C. Thereafter, the substrate transport mechanisms MHU3 of the two developing-treatment layers 3B and 3C or the substrate transport mechanism MHU6 receives the substrate W from the post-exposure cleaning unit SOAK, and transports the substrate W to the post-exposure bake treatment unit PEB.

The present invention is not limited to the foregoing examples, but may be modified as follows.

(1) In the fourth embodiment described above, the interface area 58 is located such that an end portion thereof adjacent to the exposure device EXP is accommodated within the two developing-treatment layers 3B and 3C. In this regard, as described in the first embodiment, the interface area 58 may be located such that the end portion thereof adjacent to the exposure device EXP protrudes outward of the two developing-treatment layers 3B and 3C. Such a configuration of this modification can obtain the same effect as that of the fourth embodiment.

Figure 18:
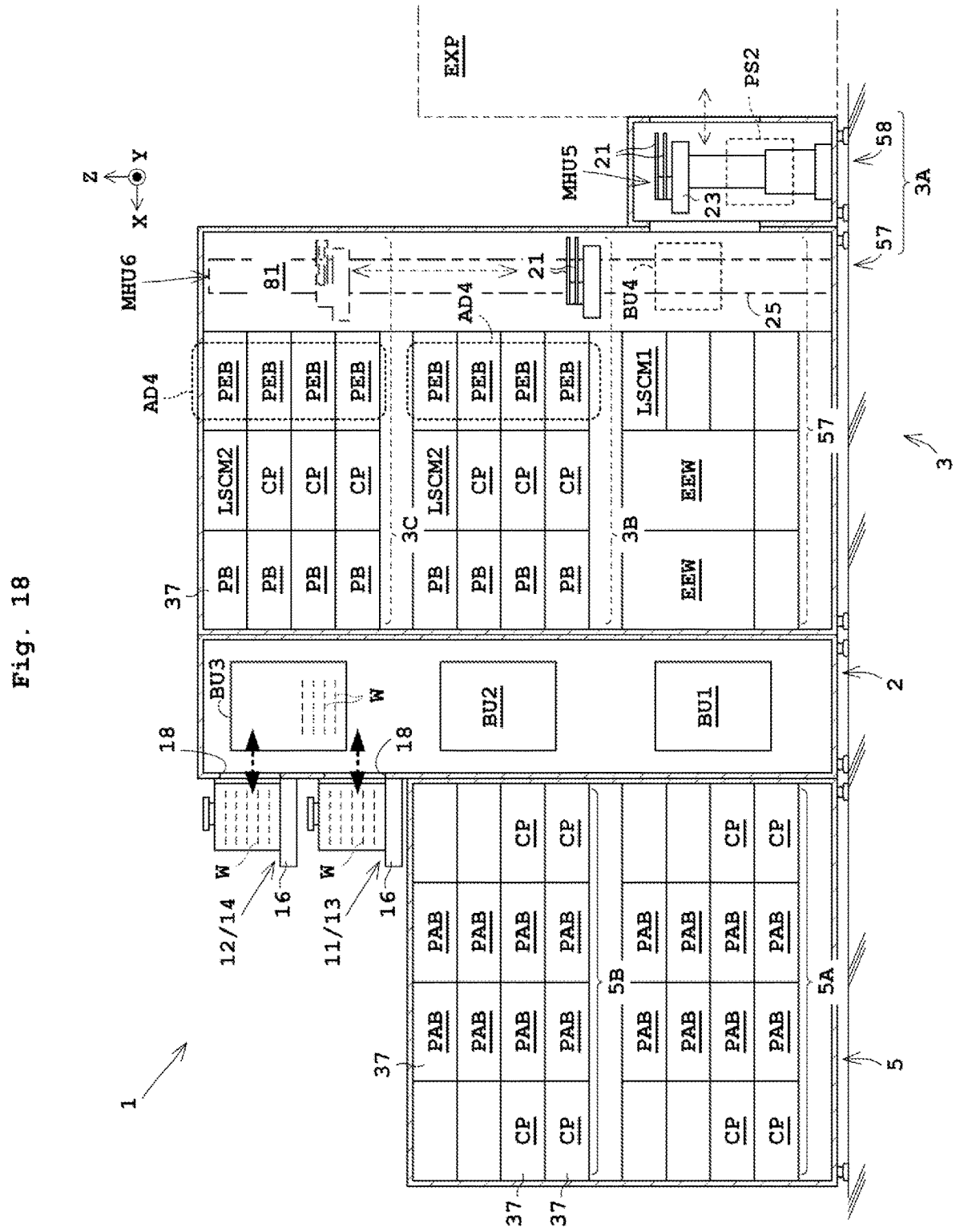
FIG. 18 is a left side view of a substrate treating apparatus according to another modification.

Reference is made to FIG. 18. The first treating block 3 includes the transportation space 81 that extends in the up-down direction from the treating area 57 in the IF layer 3A through the two developing-treatment layers 3B and 3C, and the sixth substrate transport mechanism MHU6 located in the transportation space 81. As shown in FIG. 18, the two developing-treatment layers 3B and 3C each include the four post-exposure bake treatment units PEB (adjacent treating units AD4) that are located adjacent to the transportation space 81. The substrate transport mechanism MHU6 takes the substrate W from the substrate platform PS2, and directly transports the substrate W to one of the four post-exposure bake treatment units PEB in either of the two developing-treatment layers 3B and 3C.

(2) In the first and second embodiments described above, the first treating block 3 includes the IF layer 3A and the two developing-treatment layers 3B and 3C, and the second treating block 5 includes the two coating-treatment layers 5A and 5B. In this regard, arrangement of the two developing-treatment layers 3B and 3C and the two coating-treatment layers 5A and 5B may be reversed. That is, the first treating block 3 may include the IF layer 3A and the two coating-treatment layers 5A and 5B, and the second treating block 5 may include the two developing-treatment layers 3B and 3C.

(3) In the above embodiments and modifications, the first treating block 3 includes the two developing-treatment layers 3B and 3C. In this regard, the first treating block 3 may include one developing-treatment layer or three or more developing-treatment layers. Moreover, the second treating block 5 may include three or more coating-treatment layers. Since the carrier buffer device 8 is mounted in the second treating block 5, it is preferred that the number of coating-treatment layers is preferably equal to or smaller than the number of developing-treatment layers. In order to balance parallel treatment, it is more preferred that the number of coating-treatment layers is equal to that of developing-treatment layers.

The present invention may be embodied in other specific forms without departing from the spirit or essential attributes thereof and, accordingly, reference should be made to the appended claims, rather than to the foregoing specification, as indicating the scope of the invention.

What is claimed is:

1. A substrate treating apparatus for treating substrates, comprising:
    an indexer block provided with a carrier platform for placing a carrier capable of accommodating substrates, and including a substrate buffer with a plurality of buffer units where the substrates are placed, and an indexer mechanism configured to transport the substrates;
    a first treating block including an interface layer configured to load and unload the substrates into and from an external device, and a developing-treatment layer located on an upper part or a lower part of the interface layer; and
    a second treating block including a plurality of coating-treatment layers arranged in an up-down direction,
    the first treating block, the indexer block, and the second treating block being connected in a horizontal direction in this order,
    the indexer mechanism transporting a substrate between the carrier placed on the carrier platform and the substrate buffer,
    the indexer mechanism transporting the substrate from one of the buffer units in the substrate buffer located at a predetermined height position to another of the buffer units in the substrate buffer located at a different height position, the plurality of coating-treatment layers receiving and delivering the substrates from and to the buffer units in the substrate buffer, respectively, the buffer units located at height positions corresponding to the coating-treatment layers, respectively, the interface layer at least receiving the substrate from a first buffer unit of the buffer units in the substrate buffer, the first buffer unit being located at a height position corresponding to the interface layer, the developing-treatment layer at least delivering the substrate to a second buffer unit of the buffer units in the substrate buffer, the second buffer unit being located at a height position corresponding to the developing-treatment layer, and the carrier platform being provided so as to protrude outward from an outer wall of the indexer block, the substrate treating apparatus further comprising:

a carrier storage shelf configured to store the carrier, and a carrier transport mechanism configured to transport the carrier between the carrier platform and the carrier storage shelf, wherein the second treating block is lower in level than the first treating block, and the carrier storage shelf and the carrier transport mechanism are mounted on the upper face of the second treating block.

2. The substrate treating apparatus according to claim 1, wherein the external device is an exposure device.

3. The substrate treating apparatus according to claim 2, wherein the interface layer includes a treating area coupled with the indexer block, and an interface area coupled with the treating area, the treating area includes an exposure-related treating unit configured to perform a predetermined treatment to the substrate after the coating treatment and before the developing treatment, and a transport mechanism configured to transport the substrate among the substrate buffer of the indexer block, the exposure-related treating unit, and the interface area, and the interface area includes a transport mechanism for an exposure device configured to transport a substrate between the exposure device and the treating area.

4. The substrate treating apparatus according to claim 3, wherein the interface area is located such that an end portion thereof adjacent to the exposure device protrudes outward of the the developing-treatment layer.

\* \* \* \* \*